(12) United States Patent
Fukamizu et al.

(10) Patent No.: US 7,687,900 B2
(45) Date of Patent: Mar. 30, 2010

(54) SEMICONDUCTOR INTEGRATED CIRCUIT DEVICE AND FABRICATION METHOD FOR THE SAME

(75) Inventors: Shingo Fukamizu, Osaka (JP); Yutaka Nabeshima, Osaka (JP)

(73) Assignee: Panasonic Corporation, Osaka (JP)

( * ) Notice: Subject to any disclaimer, the term of this patent is extended or adjusted under 35 U.S.C. 154(b) by 148 days.

(21) Appl. No.: 12/038,060

(22) Filed: Feb. 27, 2008

(65) Prior Publication Data

US 2008/0203577 A1 Aug. 28, 2008

(30) Foreign Application Priority Data

Feb. 28, 2007 (JP) .............................. 2007-049211

(51) Int. Cl.
  *H01L 23/48* (2006.01)
  *H01L 23/52* (2006.01)
  *H01L 29/40* (2006.01)
(52) U.S. Cl. ..................... 257/690; 257/48; 257/780; 257/784; 257/785; 257/E23.02; 257/E23.033; 257/E23.044
(58) Field of Classification Search ................. 257/690, 257/780, 784, 785, E23.02, E23.033, E23.044, 257/48
See application file for complete search history.

(56) References Cited

U.S. PATENT DOCUMENTS

| | | | |
|---|---|---|---|
| 6,713,881 B2 * | 3/2004 | Umehara et al. ............. | 257/786 |
| 7,045,903 B2 * | 5/2006 | Efland et al. ................. | 257/784 |
| 2002/0011674 A1 | 1/2002 | Efland et al. | |
| 2008/0099783 A1 * | 5/2008 | Fukamizu et al. ............. | 257/177 |
| 2008/0128755 A1 * | 6/2008 | Fukamizu et al. ............. | 257/203 |
| 2008/0128826 A1 * | 6/2008 | Fukamizu et al. ............. | 257/379 |

FOREIGN PATENT DOCUMENTS

| JP | 2974022 | 9/1999 |
|---|---|---|
| JP | 2000-114309 | 4/2000 |
| JP | 2000-164620 | 6/2000 |
| JP | 2001-338955 | 12/2001 |
| JP | 2004-363340 | 12/2004 |
| JP | 3725527 | 9/2005 |
| JP | 3843624 | 8/2006 |

OTHER PUBLICATIONS

U.S. Appl. No. 11/945,605, filed Nov. 27, 2007, Fukamizu et al.
U.S. Appl. No. 11/976,963, filed Oct. 30, 2007, Fukamizu et al.
U.S. Appl. No. 11/946,282, filed Nov. 28, 2007, Fukamizu et al.

* cited by examiner

*Primary Examiner*—Long K Tran
(74) *Attorney, Agent, or Firm*—McDermott Will & Emery LLP

(57) ABSTRACT

The semiconductor integrated circuit device includes: an active element, an interlayer insulating film, first and second metal patterns made of a first metal layer formed right above the active element, first and second buses made of a second metal layer formed right above the first metal layer, and contact pads provided on the first and second buses. The contact pad has a probe testing region and a bonding region.

16 Claims, 19 Drawing Sheets

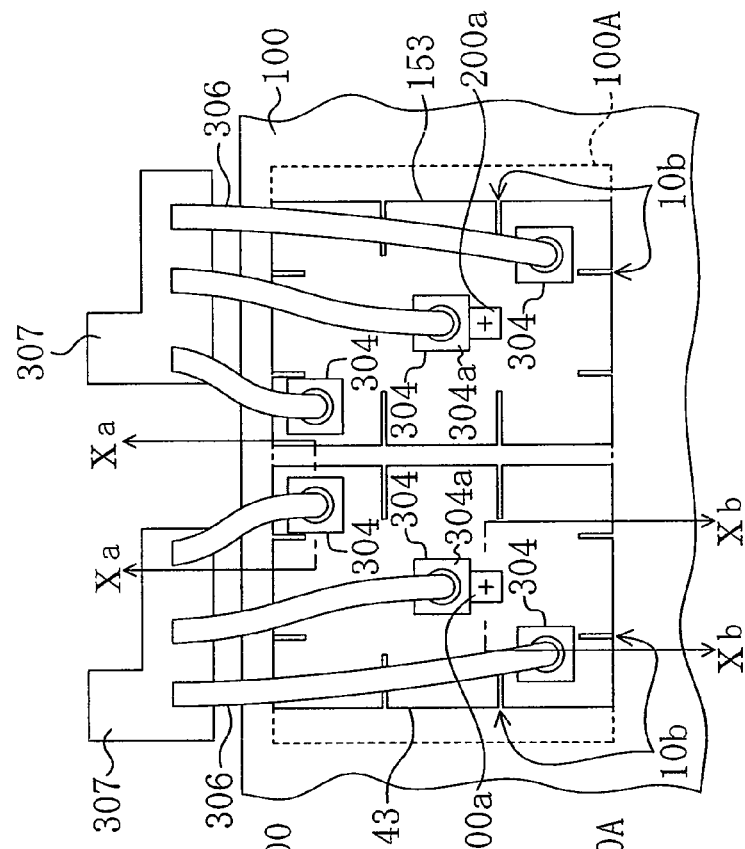
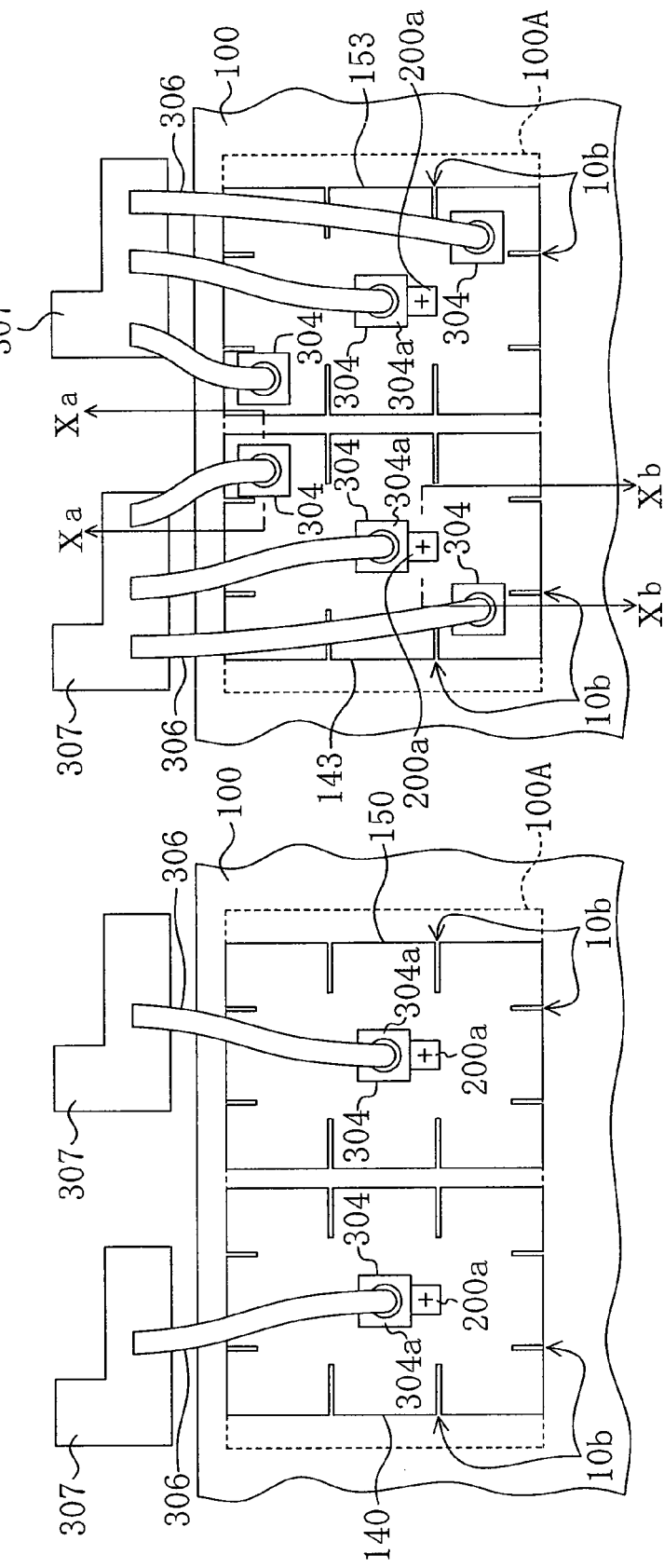
FIG. 8A
FIG. 8B

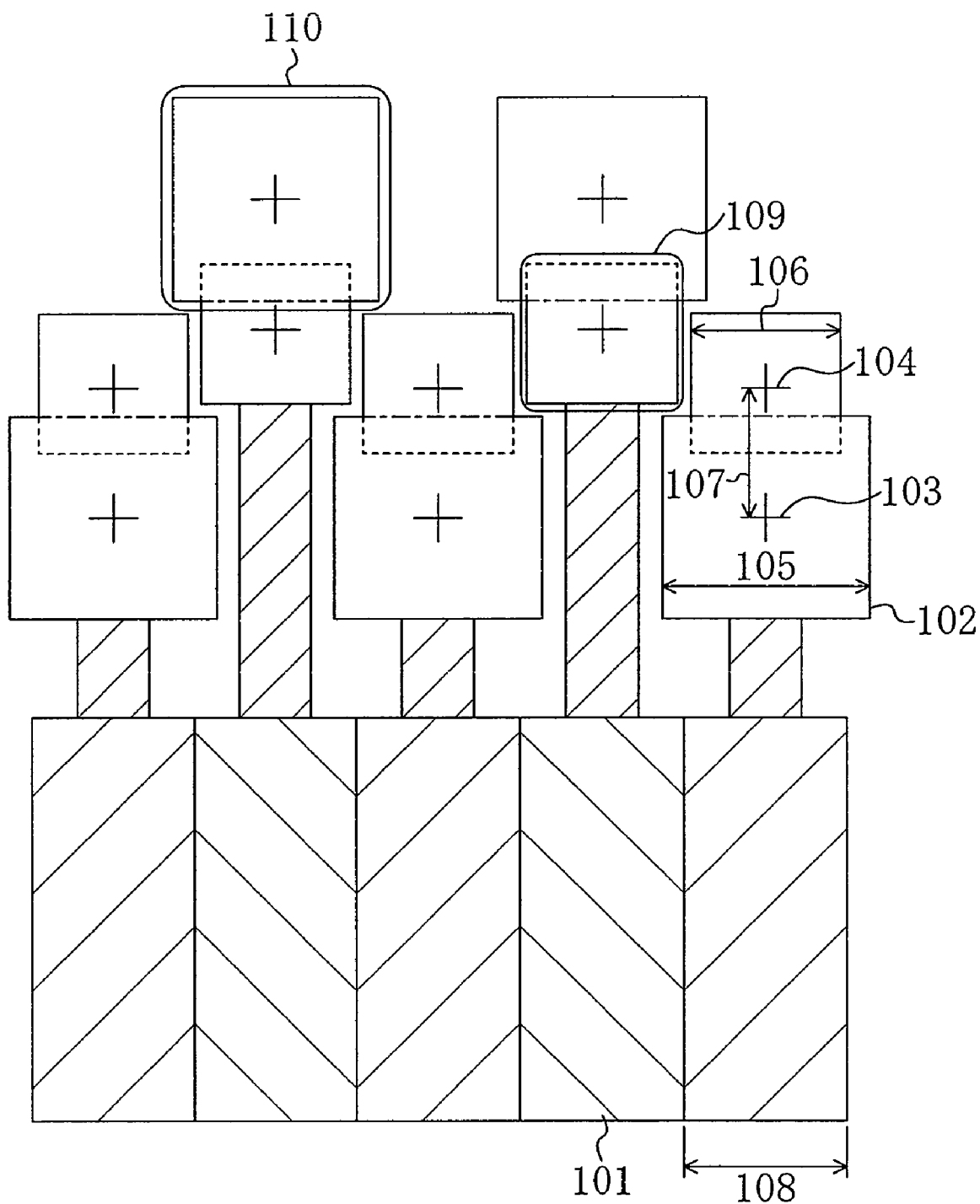

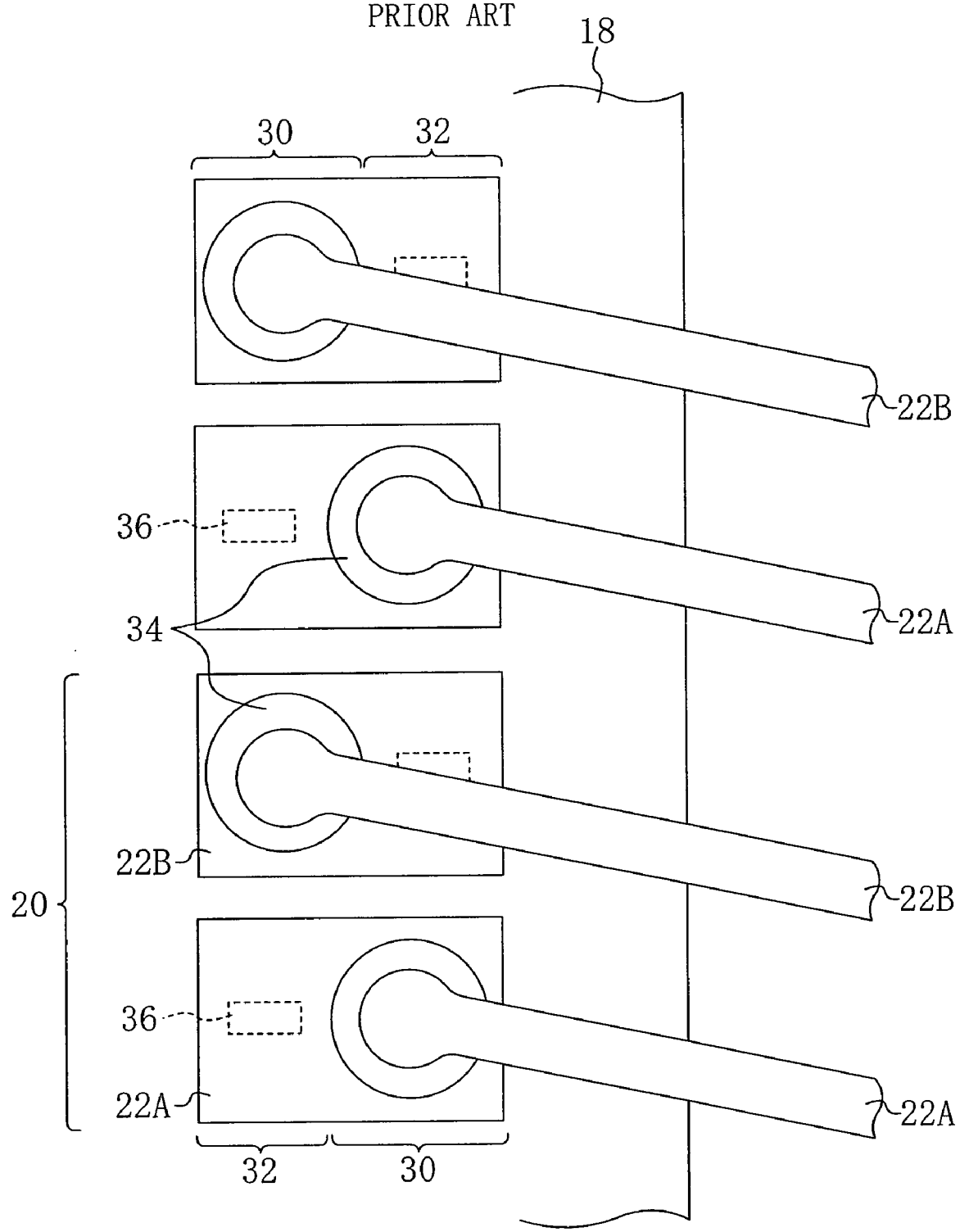

SEMICONDUCTOR INTEGRATED CIRCUIT DEVICE AND FABRICATION METHOD FOR THE SAME

BACKGROUND OF THE INVENTION

The present invention relates to a semiconductor integrated circuit device and a fabrication method for the same, and more particularly to a power integrated circuit having a structure permitting execution of wire bonding, as well as probing during testing, at a position right above an active circuit area by use of a POE (pad on element) technology, that is, a technology of placing a contact pad right above a semiconductor device, and a fabrication method for the same.

In recent years, with the spread of information technology, needs for speedup, power reduction and quality enhancement have been growing as performance capabilities of electronic equipment such as computers, information memory devices, mobile phones and digital cameras.

The performance of such electronic equipment is greatly influenced by key semiconductor electronic components such as power supplies, motor drivers, audio amplifiers and multichannel drivers, and the performance of such semiconductor electronic components is greatly influenced by power device-incorporated power integrated circuits. For this reason, as the performance capabilities of semiconductor elements constituting such a power integrated circuit, further speedup, power reduction and quality enhancement have been increasingly requested As general market requests, wide-range improvement in power devices and circuit characteristics has been desired, in addition to the speedup and power reduction described above. Also, there are a number of demands for a low-cost and reliable structure and method achievable by forming wire and solder ball bonds at positions right above active circuit areas, and various proposals for such a structure and method have been made.

Hereinafter, a prior art technology used to be available before the advent of the POE technology, that is, the technology of placing contact pads right above a semiconductor device will be briefly described.

Bonding wires serve as members connecting contact pads with external lead frames. Examples of materials used for the bonding wires include pure or alloyed gold, copper and aluminum. When gold is used as the material, the diameter of generally used bonding wires is in the range of about 20 to 50 μm. In wire ball bonding, a ball is usually attached to a chip. During the bonding work, therefore, when the ball is pressed into a typical nail-head shape by a bonding capillary, the area of the contact pad must be large enough to allow the ball to be fixed thereto. Since the diameter of the ball in its free state is typically about 1.2 to 1.6 times the wire diameter, the shape of the contact pad must be a square having a size in the range of about 50×50 μm to 150×150 μm depending on the process parameters. If solder balls are used as the connecting members, the diameter of the balls is typically in the range of about 0.2 to 0.5 mm, and the shape of the contact pads must be a square having a size in the range of about 0.3 to 0.7 mm. Note that the term solder ball does not necessarily imply that the solder contacts are spherical. They may have various shapes including semispherical, half-dome, truncated-cone and general bump shapes. The exact shape depends on the deposition technique, the reflow technique and the material composition.

Compact pads are generally placed in a substantially linear arrangement along the periphery of a chip, consuming large areas of "silicon real estate" (a chip is formed on a substrate overwhelmingly made of silicon semiconductor material). In recent semiconductor integrated circuit devices, numerous contact pads are required: the number often reaches several hundreds for ground and power connections alone. Together with signal connections, more than 1000 contact pads are required, sacrificing a large amount of precious silicon real estate.

It has been found from the experiences over several years that the wire bonding process exerts considerable stress on underlying layers of metal and dielectrics. Factors responsible for this are: the impact of the bonding capillary (for pressing a gold ball to form a nail-head contact); the frequency and energy of ultrasonic vibration of the bonding capillary and the gold ball (for breaking through an aluminum oxide film on the surface of the exposed metal layer); and the time and temperature of the process (for initiating the formation of intermetallic compounds of gold/aluminum weld). Due to the stress during the wire bonding process and the stress exerted during multi-probe testing and post-assembly device operation, cracks or craters may be formed in layers under the contact pads. To avoid such risks, design rules have been established in the last several years for the layout of semiconductor integrated circuits, which prohibit circuit structures from being placed in the areas under the contact pads and also recommend avoiding the use of brittle, mechanically weak dielectric materials. Therefore, a large amount of silicon real estate is required just for placing the contact pads.

Under the circumstances described above, there are intensified requests for substantial improvement in power devices and circuit characteristics, and for a low-cost and reliable structure and method achievable by forming wire and solder ball bonds at positions right above active circuit areas, as well as for speedup and power reduction of the semiconductor integrated circuits as described above.

[Speedup of Semiconductor Integrated Circuit]

Impediments to the speedup of a semiconductor integrated circuit are delay of MOS transistors themselves and wiring delay in interconnects in overlying layers. Conventionally, the delay of MOS transistors themselves has been reduced by a submicron technology of shortening the gate length. As the delay of MOS transistors themselves has been made smaller, however, the problem of the wiring delay has become more eminent.

To reduce the wiring delay, it has been attempted to adopt an insulating film low in dielectric constant (low dielectric film) as the insulating film interposed between interconnects. However, a low dielectric film attaining a dielectric constant of 3.0 or less is greatly lower in mechanical strength than silicon oxide films conventionally adopted. This raises problems in the assembly process, which is responsible for packaging of semiconductor integrated circuit devices and performed after completion of the diffusion process responsible for circuit formation of the semiconductor integrated circuit devices, particularly in the wire bonding process.

Hereinafter, specific problems in the conventional probe testing and wire bonding will be described.

FIGS. 16A and 16B show simplified cross-sectional views of part of a conventional IC chip.

Referring to FIGS. 16A and 16B, an n-type buried region 913 and an n-type well region 917 are formed in a p-type silicon substrate 911. A power transistor 100C composed of a gate oxide 930, polysilicon gates 931 and source/drain contact regions 921 is formed on the n-type well region 917. A first inter-level insulator layer 941 is formed to cover the power transistor 100C. First vias 942 are formed through the first inter-level insulator layer 941 to be in contact with the source/drain contact regions 921. Lines SN for source electrodes and lines DN for drain electrodes are formed on the first inter-level insulator layer 941. A second inter-level insulating film 944 is formed to cover these lines SN and DN. Second vias X are formed through the second inter-level insulator layer 944 to be in contact with the lines SN for source electrodes (likewise, vias (Y) coming into contact with the lines DN for drain electrodes are formed although not shown). A second-layer bus 11 made of a metal layer is formed on the second inter-level insulator layer 944, and a third inter-level insulator layer 947 is formed covering the second-layer bus 11. Third vias X1 are formed through the third inter-level insulator layer 947 to be in contact with the second-layer bus 11 (likewise, vias (Y1) coming into contact with second-layer buses are formed although not shown). Third-layer buses 140C and 150C made of a metal layer are formed on the third inter-level insulator layer 947, and a fourth inter-level insulator layer 950 and a protective overcoat layer 955 are formed on the third-layer buses 140C and 150C. An opening 956 is formed through the fourth inter-level insulator layer 950, and inside the opening 956 formed are a contact pad 304, a ball 961 and a bonding wire 306.

In the conventional example having the configuration described above, as shown in FIG. 16A, when probe testing or wire bonding is performed on the contact pad 304, an impact load by the probing or the wire bonding causes a warp 972 to occur in the third-layer bus 140C, for example, via the contact pad 304. The warp 972 transfers to the inter-level insulator layer 947 underlying the third-layer bus 140C, deforming the inter-level insulator layer 947 greatly to eventually cause a crack 973 in the inter-level insulator layer 947, as shown FIG. 16B. Such a warp 972 or crack 973 becomes a cause of poor reliability, which is brought by coming off of the contact pad or peeling off of the interlayer insulating film.

In recent years, semiconductor elements having contact pads placed above transistors have been developed for the purpose of reducing the size and cost of the semiconductor elements. In such semiconductor elements, if a low dielectric film low in mechanical strength is used as insulating films between interconnects and between layers, the low dielectric film will be deformed with an impact of probing or wire bonding, making the transistors susceptible to the impact. The transistors will therefore be damaged causing quality failure.

Measures against the above problems are suggested in the following patent documents.

In Japanese Patent Gazette No. 2974022 (Patent Document 1), a metal layer is formed right under a contact pad with an interlayer insulating film therebetween and is connected with the pad via a via. The metal layer therefore receives an impact applied to the interlayer insulating film at wire bonding. Moreover, the via supports the metal layer from being deformed in the direction of application of the impact. In this way, in Patent Document 1, with the contact pad structure that can compensate the reduction in the mechanical strength of the interlayer insulating film formed right under the pad, transistors are prevented from being damaged due to wire bonding.

When copper is used as the metal material, copper interconnects will be formed in a damascene process. In this process, after electrolytic plating of copper, the plated copper is subjected to chemical mechanical polishing (CMP) for flattening. In CMP, a copper pattern having a soft nature will have a phenomenon called dishing in which the center portion thereof is shaved to become very thin if the area of the copper pattern is very large. Moreover, if the area of the copper pattern is made very large while the metal layer is thinned for formation of a fine via pattern in an underlying layer, the copper may partly be shaved off completely by CMP.

In Patent Document 1 described above, the above phenomenon occurs during formation of the second metal layer, or a copper layer. If a copper pattern becomes thin in its center or copper is partly shaved off completely, as described above, the impact of wire bonding received by the interlayer insulating film will be great, and this will increase the possibility of occurrence of cracking.

Japanese Patent Gazette No. 3725527 (Patent Document 2) describes a contact pad structure that can prevent insulating films and transistors located right under contact pads from being damaged due to wire bonding. Specifically, a semiconductor device in Patent Document 2 includes a first electrode made of a conductive layer, an external connection electrode made of a conductive layer formed on the first electrode, and a second electrode of at least one layer formed under the first electrode and connected with the first electrode via a through hole. A number of protrusions are formed on the periphery of the second electrode.

By adopting the above structure in which the top-layer metal and the underlying metal layer (lower-layer metal) with an interlayer insulating film interposed therebetween are connected with each other via a via, it is possible to prevent occurrence of deformation or cracking in the low dielectric film adopted as the insulating film between interconnects and between layers located right under a contact pad under an impact of wire bonding. In other words, the top-layer metal, supported by the lower-layer metal, won't be deformed under an impact of wire bonding. This suppresses the impact of wire bonding from transferring to the low dielectric film as the interlayer insulating film located right under the compact pad, and thus can prevent deformation and cracking of the low dielectric film.

Moreover, a number of protrusions are formed on the periphery of the lower-layer metal for preventing dishing in CMP that may occur with increase of the area of the lower-layer metal. This increases the surface area of the lower-layer metal and thus enhances the cohesion of the lower-layer metal with the interlayer film. Transistors are therefore less damaged under an impulse of wire bonding, and also the interlayer insulating film is prevented from cracking.

As described above, the contact pad structure adopted in Patent Document 2 can prevent insulating films and transistors right under contact pads from being damaged due to wire bonding, and thus contributes to speedup of semiconductor integrated circuits.

[Power Reduction of Semiconductor Integrated Circuit]

An impediment to the power reduction of semiconductor integrated circuits is to implement a power device-incorporated power integrated circuit in which a submicron MOS process is utilized to minimize the chip area of the semiconductor product while making effective use of the chip area. In such a power integrated circuit, a pulse width modulation (PWM) drive technology is generally used in driving the power device for the purpose of power reduction. In this PWM drive, reduction in the ON resistance of the power device is a critical process technology leading to power reduction.

U.S. Patent Application No. 2002-0011674 (Patent Document 3) proposes a method of reducing the ON resistance of a power device as much as possible using the POE technology. In this patent document, the power integrated circuit permits execution of wire bonding right above an active circuit area. In this power integrated circuit, by use of the POE technology, a plurality of contact pads are placed right above buses connected to electrodes of a power transistor, and the plurality of contact pads are connected with a lead frame via bonding wires. This structure minimizes the resistance value and current route from the connecting members to the electrodes, and thus permits improvement in the electrical characteristics of the power transistor.

FIG. 17 is a simplified plan view of part of a semiconductor integrated circuit described in Patent Document 3.

As shown in the plan view of FIG. 17, an active area 2 of a power transistor is formed in an IC chip 1. Above the active area 2, formed are a first bus 3 connected with all source electrodes and a second bus 4 connected with all drain electrodes. Both the first and second buses 3 and 4 are made of sheet-like metal. Three contact pads 5 are formed on each of the first and second buses 3 and 4 to be commonly connected with the bus. The three contact pads 5 on the first bus 3 are placed to be bilaterally symmetric with the three contact pads 5 on the second bus 4. Bonding wires 6 are provided to connect the contact pads 5 with external lead frames 7.

In Patent Document 3 having the above configuration, in which a plurality of contact pads are placed right above a bus connected with electrodes of a power transistor and the plurality of contact pads are connected with a lead frame via bonding wires, a power integrated circuit permitting low ON resistance can be implemented. This contributes to power reduction as a performance capability of a semiconductor integrated circuit.

[Quality Enhancement of Semiconductor Integrated Circuit]

A great impediment to the quality enhancement as a semiconductor performance capability is a problem of a probe mark left on the surface of a contact pad for bonding of the semiconductor device.

To state more specifically, when an electrical characteristics test is performed for a contact pad having a minimum size required for testing and bonding and thereafter bonding is attempted for the same contact pad, the bonding may fail. This is mainly because a probe needle as a testing tool applied to the contact pad for bonding during the characteristics test leaves a probe mark on the contact pad.

Also, as contact pads are becoming finer, the proportion of a probe mark in the size of a contact pad is greater, causing a problem that the probe mark may block execution of crimping and alloy formation during bonding.

To address the above problem caused by a probe mark on the surface of a contact pad for bonding of a semiconductor device, Japanese Patent Gazette No. 3843624 (Patent Document 4) proposes a technique in which some contrivance is made on the layout of contact pads to solve the problem.

FIG. 18 is a simplified plan view showing a pad layout on the periphery of a semiconductor chip described in Patent Document 4.

As shown in FIG. 18, a protection circuit and control logic are mounted in each contact pad cell body 101. The reference numeral 109 denotes an electrode region for testing and 110 denotes an electrode region for bonding. For the regions 110, the minimum size, i.e., a width 105, is defined from the accuracy of the bonding apparatus and the physical factors of bonding wires, to ensure the bonding. For the regions 109, the minimum size, i.e., a width 106, is defined from the accuracy of the testing apparatus and the physical characteristics of pins for testing, to ensure the testing.

A contact pad 102 is formed by placing the regions 109 and 110 to adjoin each other or to overlap each other, which is therefore of a convex shape as illustrated as one feature.

The reference numeral 103 denotes the center position of the contact pad region 110 for bonding, and 104 denotes the center position of the contact pad region 109 for probe testing.

A distance 107 indicates the minimum distance between the center 103 of the contact pad region 110 for bonding and the center 104 of the contact pad region 109 for probe testing. This distance, which is the most critical distance in Patent Document 4, is for guaranteeing that even if a probe mark is left on a contact pad after application of a probe needle during a characteristics test, bonding can be made reliably as long as this distance is maintained.

As described above, by defining the distance 107, it is guaranteed that both testing and bonding can be made reliably even if the regions 109 and 110 are placed to overlap each other with the centers 103 and 104 thereof being apart from each other by a distance equal to or longer than the distance 107. Thus, the effect of reducing the contact pad area can also be expected.

To state more specifically, in a semiconductor integrated circuit device, each of a plurality of contact pads is formed by placing a first rectangular electrode region for bonding and a second rectangular electrode region for testing in contact with each other. The plurality of contact pads include: first contact pads in which the first rectangular electrode region and the second rectangular electrode region are arranged in this order toward the outside of the semiconductor integrated circuit device; and second contact pads in which the second rectangular electrode region and the first rectangular electrode region are arranged in this order toward the outside of the semiconductor integrated circuit device. Such first contact pads and second contact pads are arranged alternately. With this configuration, in semiconductor integrated circuit devices becoming finer and finer, the region for testing and the region for bonding are regarded independently in each contact pad. The minimum values of the widths of these regions and the distance between the regions are previously determined based on the information on the accuracy of the testing and bonding apparatuses, the machining accuracy of pins for probing and the like. The contact pads are then designed so as to secure the minimum values. In this way, with no flaw being formed on the surface of the contact pad for bonding even when a flaw is produced on the surface of the contact pad for probe testing, highly reliable wire bonding can be performed. In other words, the effect of ensuring the testing and assembly of the semiconductor integrated circuit device can be provided.

There is another problem that a contact pad for bonding in a semiconductor chip may be damaged at the contact of a probe during a characteristics test. Aluminum on the surface of the damaged portion may be peeled off, causing reduction in the area in which an alloy layer is to be formed and as a result degradation in metal wire junction reliability. Japanese Laid-Open Patent Publication No. 2001-338955 (Patent Document 5) proposes a technique for solving the above problem.

FIG. 19 is a simplified plan view showing a pad layout on the periphery of a semiconductor chip described in Patent Document 5.

As shown in FIG. 19, a plurality of contact pads for bonding, each including a first region as a connecting region and a second region for allowing contact of a probe for testing, are arranged roughly linearly. The first and second regions of each contact pad for bonding are placed side by side in a direction crossing the row of the contact pads. With this placement, no damage will be produced on the contact pad portion for bonding, permitting improvement injunction reliability. In addition, by placing the bonding regions in a staggered arrangement in the adjacent contact pads for bonding, the effect of reducing the pitch of the contact pads for bonding can be obtained.

As described above, Patent Documents 4 and 5 described above address the problem that a flaw may be produced on the surface of a contact pad for bonding of a semiconductor device by making some contrivance on the layout of the semiconductor device, to thereby contribute to the quality enhancement as a performance capability of the semiconductor integrated circuit.

However, in the conventional configurations disclosed in Patent Documents 3 to 5 described above, during bonding to a contact pad located right above a power transistor, in particular, warping increases on the periphery of a top-layer wide bus formed under the contact pad due to the stress caused by a load applied to the contact pad, and this causes cracking in an insulating film. The reason for this cracking is as follows. Because of the increase of warping on the periphery of the top-layer wide bus under the contact pad and the reduction in the strength of the insulating film under the contact pad, the stress caused by a load applied to the contact pad cannot be absorbed by the top-layer wide bus and the insulating film under the contact pad. If a crack reaches an insulating film in the lower part, a semiconductor element in the lower part will be damaged.

In other words, because of the failure to relieve the mechanical dynamic stress due to the wire bonding transferred from the contact pad placed right above the power transistor, warping occurs on the periphery of the wide large bus, and thus cracking occurs in the insulating film at the periphery of the contact pad and the top-layer wide bus.

The chip size and the number of pins are further being increased in fine processes to respond to the requests for higher functions and higher performance in the market of semiconductor integrated circuits. To guarantee the functions and performance of such semiconductor integrated circuits, improve the reliability thereof and improve the yield in subsequent steps, it is increasingly necessary to perform a plurality of times of probe testing, such as low-temperature testing, room-temperature testing, high-temperature testing and wafer burn-in testing, for the same wafer.

In the configuration disclosed in Patent Document 3 described above, however, as shown in FIG. 20B (which is a cross-sectional view taken along line XXb-XXb in FIG. 20A to be described later and corresponds to the cross-sectional views of FIGS. 16A and 16B), there arises the problem that warping may occur on the periphery of the top-layer wide bus formed under the contact pad, which is located right above the power transistor, due to the stress caused by a load applied to the contact pad during a plurality of times of probe testing performed for the contact pad.

To state more specifically, when a probe needle 52 comes into contact with the contact pad 304, that is, when the tip of the probe needle 52 is pressed against the contact pad 304 under an appropriate pressure, the tip of the probe needle 52 is engaged into the contact pad 304 while the probe needle 52 slides in the horizontal direction. This generates a low contact electric resistance between the probe needle 52 and the contact pad 304. At this time, the stress applied from the probe needle 52 is consumed by the plastic deformation of the metal constituting the contact pad 304. However, with the probe needle 52 coming into contact with the contact pad 304 a plurality of times, warping may occur on the periphery of the top-layer wide bus formed under the contact pad 304. Moreover, with the probe needle 52 coming into contact with the contact pad 304 a plurality of times, the contact pad 304 may be thinned, and if the tip of the probe needle 52 reaches a position near the bottom of the contact pad 304, the stress from the probe needle 52 may be applied even to the periphery of the contact pad 304 and the underlying structure, and eventually cracking may occur.

Moreover, in the configuration disclosed in Patent Document 3 described above, as shown in FIG. 20A (which is a plan view corresponding to the simplified plan view of FIG. 17), there arises the problem of a probe mark formed on the surface of the contact pad 5 for bonding of the semiconductor integrated circuit device during probe testing. After completion of the semiconductor wafer process, testing is performed on whether the semiconductor chip 1 formed in the wafer is acceptable or not. In this testing, a probe for testing connected to a testing circuit such as an IC tester is brought into contact with the contact pad 5 for bonding made of aluminum and the like placed in the chip 1 for connection with a bonding wire. To reduce the contact resistance between the probe for testing and the contact pad 5 for bonding, the probe for testing is pressed against the contact pad 5 for bonding under a predetermined load or more. Therefore, part of the aluminum of the contact pad 5 for bonding is removed in the contact portion with the probe for testing, leaving a probe mark on the surface of the contact pad 5 for bonding. This probe mark may cause a problem of degrading the connection strength of the wire bonding performed after the testing for the contact pad 5 for bonding.

When the contact pads located above the power transistor are arranged linearly in one row with respect to a side of the chip, the pitch of the contact pads is small. Assume that the pad pitch is 80 μm or less, for example. In this case, when the diameter of the bases of probe needles of a probe card for a tester is 70 μm, for example, the probe needles will fail to be arranged side by side because adjacent probe needles come into electrical contact with each other, and it is difficult to prepare probe needles having a narrow base. Thus, although the contact pads are arranged linearly in one row with respect to a side of the chip, it is difficult to attain a pad pitch of 80 μm or less because a probe card for a tester having a narrow needle base cannot be prepared, and thus difficult to increase the number of pins. In other words, in semiconductor integrated circuit devices, if an attempt is made to attain a narrow pad pitch above a power transistor, it is difficult to satisfy both the package assembly and the wafer probing.

SUMMARY OF THE INVENTION

An object of the present invention is providing a semiconductor integrated circuit device having a configuration attaining the placement of contact pads right above a power transistor, which can relieve the mechanical dynamic stress of probing during testing and the mechanical dynamic stress of wire bonding during assembly, permits a plurality of times of probe testing for the same wafer and supports probe testing and increase in the number of pins, these attainable by devising the layout of contact pads and power transistors, and a fabrication method for such a semiconductor integrated circuit.

With the above configuration, occurrence of warping on the periphery of a bus, which may cause a damage or stress on the power transistor, is prevented and thus occurrence of cracking at the periphery of the contact pad is reduced. Also, assembly by wire bonding after a plurality of times of probe testing is reliably achieved. Thus, a highly reliable semiconductor integrated circuit device capable of attaining power reduction, chip area saving and pitch narrowing for probe testing, as well as a fabrication method for the same, are provided.

The semiconductor integrated circuit device in the first form of the present invention includes: an integrated active element formed on a semiconductor substrate; an interlayer insulating film formed on the active element; at least one or more first metal patterns made of a first metal layer formed in the interlayer insulating film at a position right above the active element, for acting as a first electrode of the active element; at least one or more second metal patterns made of the first metal layer for acting as a second electrode of the active element; a first bus made of a second metal layer formed in the interlayer insulating film at a position right above the first metal layer, the first bus being electrically connected with the at least one or more first metal patterns; a second bus made of the second metal layer, the second bus being electrically connected with the at least one or more second metal patterns; and at least one or more contact pads provided on the first bus and the second bus, wherein the contact pad has a probe testing region and a bonding region.

With the above configuration, since the mechanical stress applied to each active element can be dissipated, the reliability can be improved. Having the exclusive region for probe testing, the constraints of the measurement/fabrication facilities can be avoided, and having the exclusive region for bonding, the reliability of adhesiveness can be improved. Moreover, since the POE-based topmost layer is free from any under-layer constraints, reliability-oriented layout can be realized.

The semiconductor integrated circuit device in the second form of the present invention includes: an integrated active element formed on a semiconductor substrate; an interlayer insulating film formed on the active element; at least one or more first metal patterns made of a first metal layer formed in the interlayer insulating film at a position right above the active element, for acting as a first electrode of the active element; at least one or more second metal patterns made of the first metal layer for acting as a second electrode of the active element; at least one or more first buses made of a second metal layer formed in the interlayer insulating film at a position right above the first metal layer, the first bus being electrically connected with a corresponding first metal pattern among the at least one or more first metal patterns; at least one or more second buses made of the second metal layer, the second bus being electrically connected with a corresponding second metal pattern among the at least one or more second metal patterns; at least one or more contact pads for probe testing provided for each of the first bus and the second bus, the contact pad for probe testing including a probe testing region; and at least one or more contact pads for bonding provided for each of the first bus and the second bus, the contact pad for bonding including a bonding region.

With the above configuration, since the mechanical stress applied to each active element can be dissipated, the reliability can be improved. Having the exclusive compact pad for probe testing, the constraints of the measurement/fabrication facilities can be avoided, and having the exclusive compact pad for bonding, the reliability of adhesiveness can be improved. Moreover, since the POE-based topmost layer is free from any under-layer constraints, reliability-oriented layout can be realized.

In the semiconductor integrated circuit device in the second form of the invention, the contact pad for probe testing is placed adjacent to the contact pad for bonding. Thus, having the exclusive compact pad for probe testing, the constraints of the measurement/fabrication facilities can be avoided, and having the exclusive compact pad for bonding, the reliability of adhesiveness can be improved.

In the semiconductor integrated circuit device in the second form of the invention, the contact pad for probe testing is drawn out with a lead and positioned outside each of the first bus and the second bus. This placement is therefore adaptable to a narrower pad pitch in probing.

In the semiconductor integrated circuit device in the first or second form of the invention, the active element is a power transistor. Thus, the ON resistance of the POE-based power transistor element can be reduced, and thus power reduction can be attained under PWM drive.

In the semiconductor integrated circuit device in the first or second form of the invention, the probe testing regions adjacent to each other and the bonding regions adjacent to each other are respectively placed to be different in the distance from a neighboring chip side. This placement is therefore adaptable to a narrower pad pitch in probing or bonding.

In the semiconductor integrated circuit device in the first or second form of the invention, each of the first bus and the second bus has at least one or more slits. Thus, since the mechanical stress applied to each active element can be dissipated, the reliability can be improved.

In the semiconductor integrated circuit device in the first or second form of the invention, each of the first bus and the second bus has a rectangular shape whose short side is a side parallel to a neighboring chip side and whose long side is a side orthogonal to the chip side. This configuration is therefore adaptable to a narrower pad pitch in probing and bonding, and thus permits chip shrinking and chip area saving.

In the semiconductor integrated circuit device in the first or second form of the invention, the probe testing region is placed closer to the chip periphery than the bonding region. This placement is therefore adaptable to a narrower pad pitch in probing.

In the semiconductor integrated circuit device in the first or second form of the invention, the bonding region is placed closer to the chip periphery than the probe testing region. With the shortened wire length, the wire resistance can be reduced, and thus power reduction can be attained.

In the semiconductor integrated circuit device in the first or second form of the invention, the probe testing regions are placed in a staggered array with respect to one direction. This placement is therefore adaptable to a narrower pad pitch in probing.

The fabrication method for a semiconductor integrated circuit device in one form of the present invention includes the steps of: forming an integrated active element on a semiconductor substrate; forming a first interlayer insulating film on the active element; depositing a first metal layer right above the active element via the first interlayer insulating film and then patterning the first metal layer, to form at least one or more first metal patterns acting as a first electrode of the active element and at least one or more second metal patterns acting as a second electrode of the power transistor; forming a second interlayer insulating film on the first interlayer insulating film so as to cover the at least one or more first metal patterns and the at least one or more second metal patterns; depositing a second metal layer right above the first metal layer via the second interlayer insulating film and then patterning the second metal layer, to form at least one or more first buses electrically connected with the at least one or more first metal patterns and at least one or more second buses electrically connected with the at least one or more second metal patterns; forming a third interlayer insulating film on the second interlayer insulating film so as to cover the first bus and the second bus; forming at least one or more openings through the third interlayer insulating film for each of the first bus and the second bus so as to expose the bus; placing at least one or more contact pads having a probe testing region and a bonding region, or placing a contact pad for probe testing including a probe testing region and a contact pad for bonding including a bonding region, on each of the first bus and the second bus exposed in the opening; and attaching at least one or more connection members to the bonding region.

By the fabrication method described above, the semiconductor integrated circuit device in the first or second form of the present invention having the effects described above can be implemented.

In the fabrication method of the invention described above, the step of patterning the second metal layer preferably includes forming at least one or more slits at each of the first bus and the second bus.

Accordingly, since contact pads can be placed right above active elements, a highly reliable semiconductor integrated circuit can be implemented. Moreover, with placement of power supply contact pads right above active elements, precious silicon real estate can be saved. With reduction in the silicon area consumed in the entire circuit design, the cost of the IC chip can be reduced. In this way, saving in IC chip area and reduction in IC cost can be attained.

BRIEF DESCRIPTION OF THE DRAWINGS

FIG. 8A is a simplified plan view diagrammatically showing part of an IC chip, as a portion of a semiconductor integrated circuit device of Embodiment 3 of the present invention, having two single buses, in which one contact pad having a probe testing region and a bonding region is placed on each bus, and slits are formed at the upper, lower, left and right edges of each bus, and FIG. 8B is a simplified plan view diagrammatically showing part of an IC chip, as a portion of a semiconductor integrated circuit device of Embodiment 3 of the present invention, having two single buses, in which a plurality of contact pads each having both a probe testing region and a bonding region or having only a bonding region are placed on each bus, and slits are formed at the upper, lower, left and right edges of each bus.

FIG. 10B illustrates a probe needle coming into contact with the probe testing region of the contact pad during probe testing prior to wire bonding.

FIGS. 16A and 16B are cross-sectional views for demonstrating the problems in the conventional semiconductor integrated circuit, in which FIG. 9A shows a large deformation of an interlayer insulating film right under a contact pad, and FIG. 16B shows a crack occurring in the interlayer insulating film right under the contact pad, both due to the stress caused by wire bonding.

FIG. 18 is a simplified plan view showing a conventional pad layout on the chip periphery.

FIG. 19 is a simplified plan view showing a conventional pad layout on the chip periphery.

FIG. 20A shows probe marks left on contact pads and FIG. 20B shows a large deformation of an interlayer insulating film right under the contact pad, due to the stress caused by at least one time or more of contact of a probe needle.

DESCRIPTION OF THE PREFERRED EMBODIMENTS

Embodiment 1

A semiconductor integrated circuit device and a fabrication method for the same of Embodiment 1 of the present invention will be described with reference to the relevant drawings.

Figure 1:
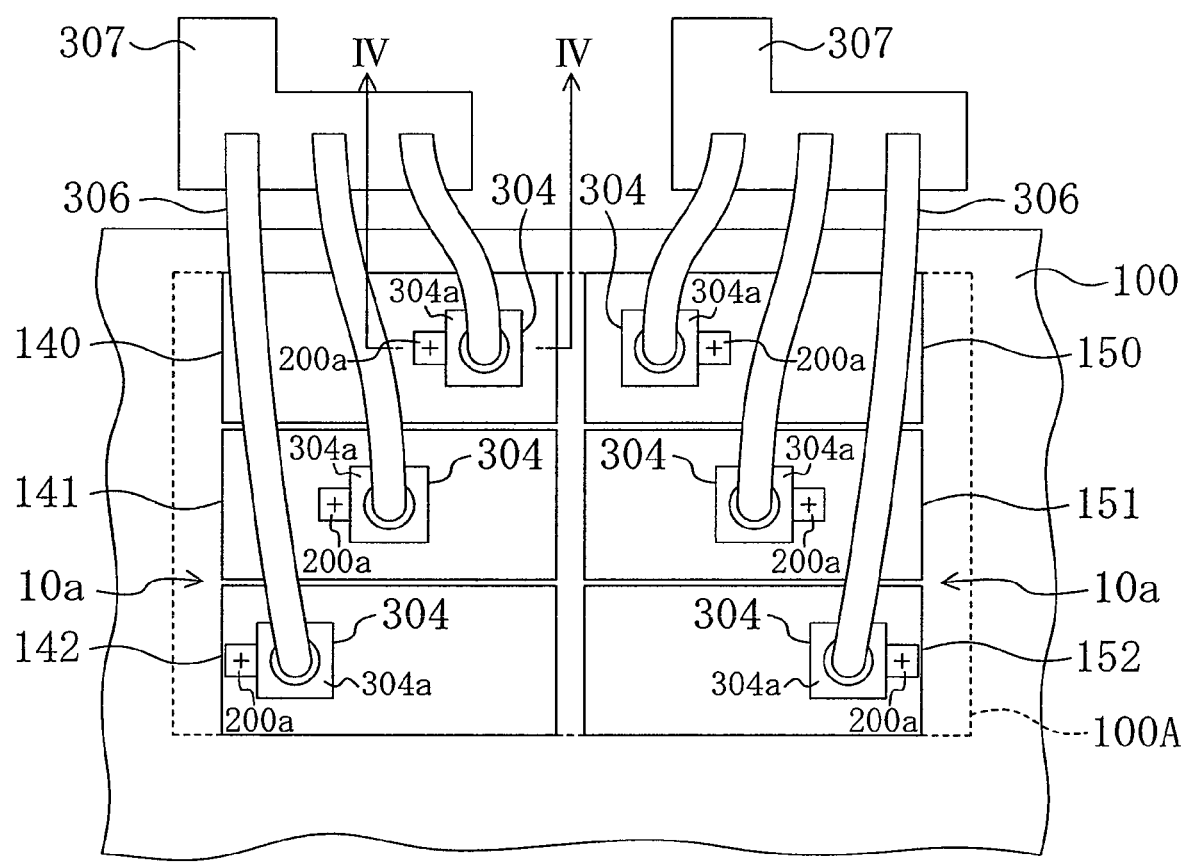
FIG. 1 is a simplified plan view diagrammatically showing part of an IC chip, as a portion of a semiconductor integrated circuit device of Embodiment 1 of the present invention, having a bus metal layer divided into a plurality of buses with slits, in which one contact pad having a probe testing region and a bonding region is placed on each bus.

FIG. 1 is a simplified plan view of part of the semiconductor integrated circuit device of Embodiment 1 of the present invention.

As shown in the plan view of FIG. 1, a power transistor 100A surrounded with an isolation layer is formed as an active element in an IC chip 100. Buses 140 to 142 and buses 150 to 152 are formed to cover source and drain regions of the power transistor 100A. The buses 140 to 142, which are in a topmost metal layer (third metal layer) made of sheet-like metal, are connected with source electrodes. The buses 140 to 142 are obtained by dividing a large-size bus equally with slits 10a. Likewise, the buses 150 to 152, which are in the topmost metal layer (third metal layer) made of sheet-like metal, are connected with drain electrodes. The buses 150 to 152 are obtained by dividing a large-size bus equally with slits 10a. At least one contact pad 304 is formed on each of the buses 140 to 142 and 150 to 152. One external lead frame 307 (power supply) is provided for the buses 140 to 142, and one external lead frame 307 (power supply) is provided for the buses 150 to 152. A bonding wire 306 is provided to connect the lead frame 307 with each contact pad 304.

Each of the contact pads 304 formed on the buses 140 to 142 and 150 to 152 has a probe testing region 200a and a bonding region 304a.

As shown in FIG. 1, the slits 10a are formed at the upper, lower, left and right edges of the buses 140 to 142 and 150 to 152. Having these slits, the stress caused by a load applied to the contact pads 304 at wire bonding and at probing during testing can be relieved.

Figure 2:
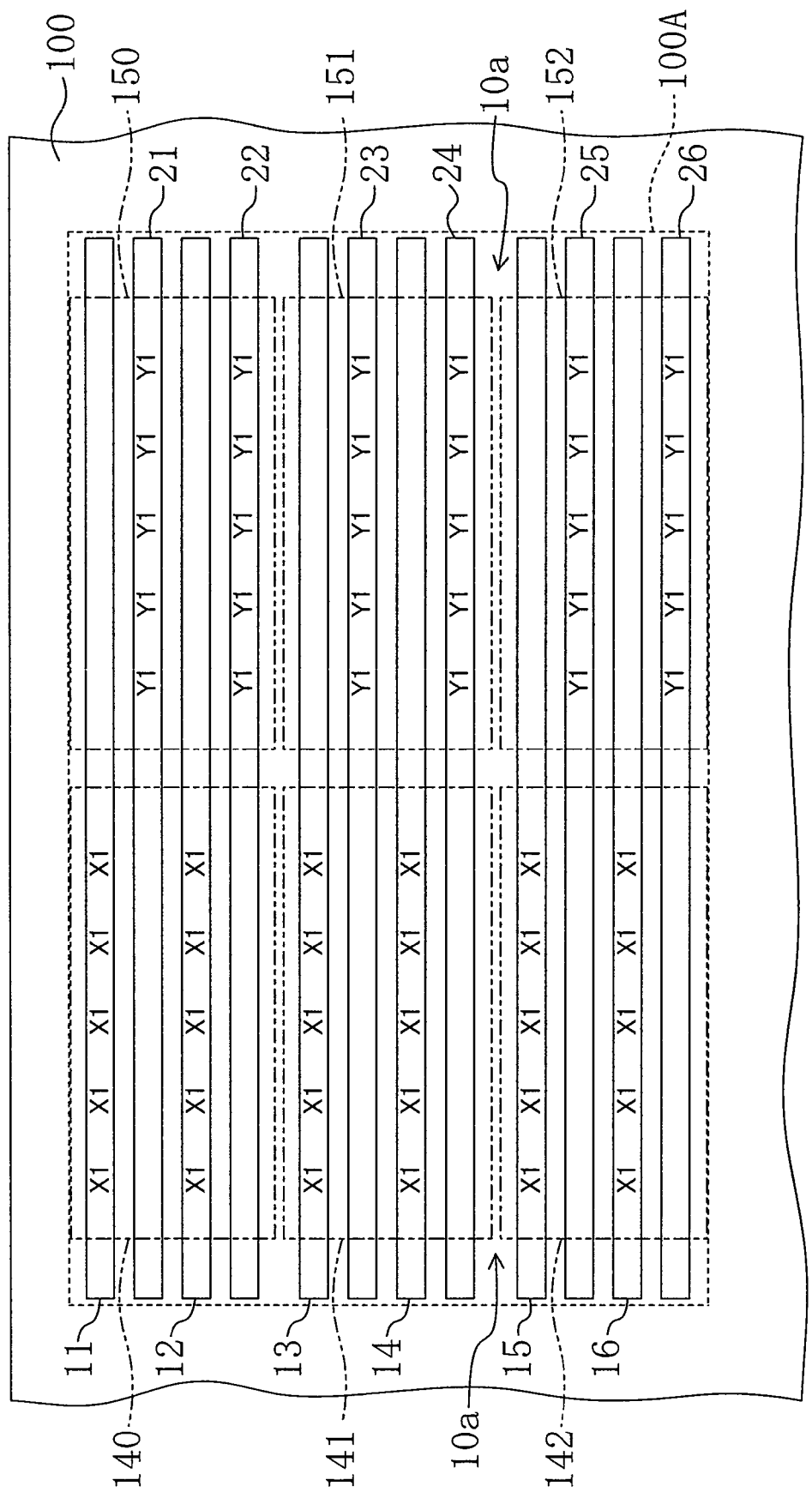
FIG. 2 is a simplified plan view diagrammatically showing part of an IC chip, as a portion of the semiconductor integrated circuit device of Embodiment 1 of the present invention, illustrating the positional relationship among a bus metal layer (third-layer buses) divided into a plurality of buses with slits, a metal layer (second-layer buses) underlying the above metal layer, which is to be lines for source and drain electrodes, and vias.
Figure 3:
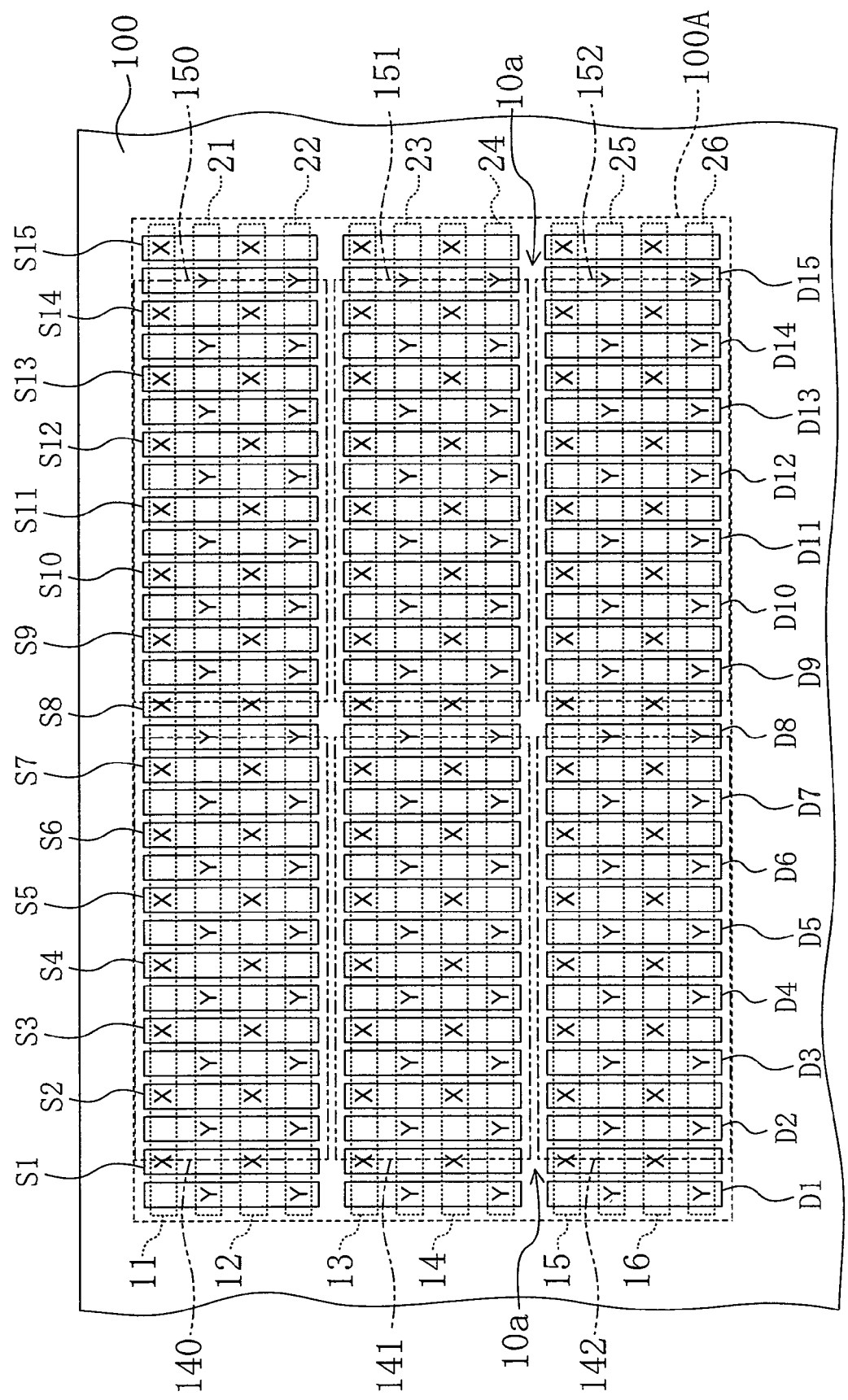
FIG. 3 is a simplified plan view diagrammatically showing part of an IC chip, as a portion of the semiconductor integrated circuit device of Embodiment 1 of the present invention, illustrating the positional relationship among the bus metal layer (third-layer buses) divided into a plurality of buses with slits, the metal layer (second-layer buses) underlying the above metal layer, which is to be lines for source and drain electrodes, a metal layer (third-layer buses) further underlying the above metal layer, which is to be the source and drain electrodes, and vias.

FIGS. 2 and 3 are plan views diagrammatically showing the positional relationships between the buses 140 to 142 and 150 to 152 shown in FIG. 1 and the underlying metal layers. Note that the buses 140 to 142 and 150 to 152 are shown by phantom lines in FIGS. 2 and 3, and the second-layer buses are also shown by phantom lines in FIG. 3.

As shown in FIG. 2, under the buses 140 to 142 and 150 to 152 as the third-layer buses in this embodiment, formed alternately are source lines 11, 12, 13, 14, 15 and 16 (first metal patterns) and drain lines 21, 22, 23, 24, 25 and 26 (second metal patterns), both as the second-layer buses (second metal layer), which are arranged in lateral elongated stripes parallel to one another at a fixed pitch. The third-layer buses 140 to 142 are respectively connected to the source lines 11 and 12, 13 and 14, and 15 and 16 as the second-layer buses via a plurality of metal-filled vias X1. Likewise, the third-layer buses 150 to 152 are respectively connected to the drain lines 21 and 22, 23 and 24, and 25 and 26 via a plurality of metal-filled vias Y1.

As shown in FIG. 3, under the source and drain lines 11 to 16 and 21 to 26 as the second-layer buses, formed alternately are lines S1 to S15 for source electrode (first metal patterns) and lines D1 to D15 for drain electrode (second metal patterns), both as the first-layer buses (first metal layer), which are arranged orthogonal to the second-layer buses in vertical elongated stripes parallel to one another at a fixed pitch. Each of the lines S1 to S15 for source electrodes as the first-layer buses are electrically connected to the source lines 11 to 16 as the second-layer buses via a plurality of metal-filled vias X. Likewise, each of the lines D1 to D15 for drain electrodes as the first-layer buses are electrically connected to the drain lines 21 to 26 as the second-layer buses via a plurality of metal-filled vias Y.

Note that FIGS. 1, 2, and 3 are views for mainly demonstrating the positional relationship among the first-layer to third-layer buses, vias, contact pads and bonding wires formed on the semiconductor substrate. As for specific configurations of interlayer insulating films not shown formed between buses, openings and the like, description will be made in a specific example shown in FIGS. 4 and 5.

Figure 4:
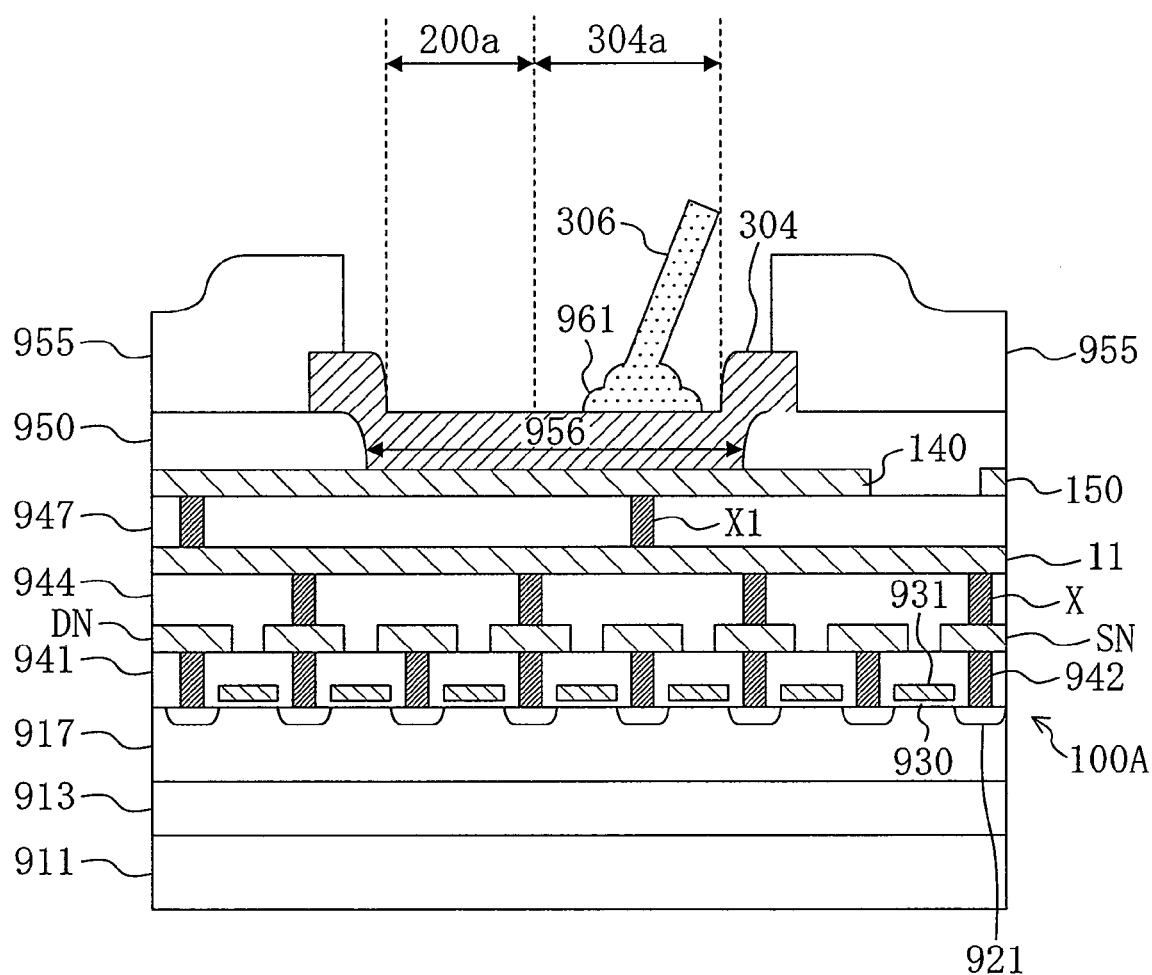
FIG. 4 is a cross-sectional view of a portion of the semiconductor integrated circuit device of Embodiment 1 of the present invention, taken along line IV-IV in FIG. 1.

FIG. 4 is a cross-sectional view taken along line IV-IV in FIG. 1, showing part of the cross-sectional structure of the semiconductor integrated circuit device of this embodiment, to demonstrate bonding against the wire bonding region of a contact pad.

As shown in FIG. 4, an n-type buried region 913, an n-type well region 917, source/drain contact regions 921, gate oxides 930 and polysilicon gates 931 are formed on a p-type silicon substrate 911. A first inter-level insulator layer 941 is formed covering these elements. First vias 942 are formed through the first inter-level insulator layer 941 to reach the source/drain contact regions 921. Lines SN for source electrodes and lines DN for drain electrodes (both first-layer buses) made of a metal layer are formed on the first inter-level insulator layer 941. A second inter-level insulator layer 944 is formed to cover the lines SN for source electrodes and the lines DN for drain electrodes. Second vias X are formed through the second inter-level insulator layer 944 to be in contact with the lines SN for source electrodes. Although not shown, vias in contact with the lines DN for drain electrodes are also formed through the second inter-level insulator layer 944. A source line (second-layer bus) 11, for example, made of a metal layer is formed on the second inter-level insulator layer 944 (a drain line (second-layer bus) is also formed in a similar manner in a section not shown). A third inter-level insulator layer 947 is formed covering the source lines and the drain lines not shown. Third vias X1 are formed through the third inter-level insulator layer 947 to be in contact with the source line 11 (likewise, vias are also formed to be in contact with a drain line in a section not shown). Third-layer buses 140 and 150 made of a metal layer are formed on the third inter-level insulator layer 947. Slits 10a are formed in the third-layer buses 140 and 150 (although not shown in FIG. 4). A fourth inter-level insulator layer 950 having an opening 956 is formed covering the buses 140 and 150. A contact pad 304 is formed inside the opening 956. A protective overcoat layer 955 is formed on the fourth inter-level insulator layer 950 exposing the contact pad 304. A ball 961 and a bonding wire 306, as illustrated, are formed on the bonding region 304a of the contact pad 304. The contract pad 304 has the bonding region 304a and the probe testing region 200a.

Figure 5:
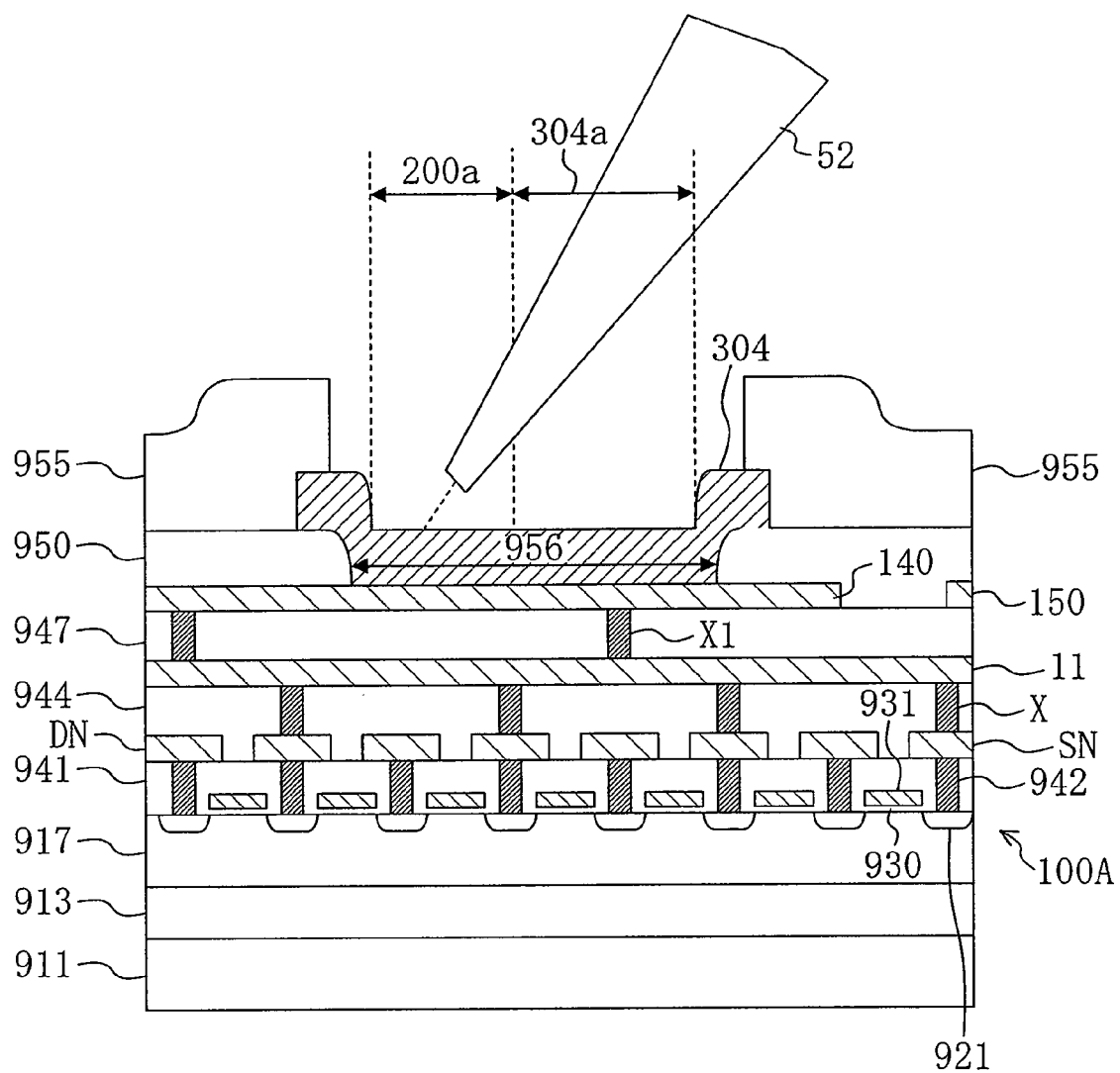
FIG. 5 is a cross-sectional view of a portion of the semiconductor integrated circuit device of Embodiment 1 of the present invention, taken along line IV-IV in FIG. 1, illustrating a probe needle coming into contact with the probe testing region of the contact pad during probe testing prior to wire bonding.

FIG. 5 is also a cross-sectional view taken along line IV-IV in FIG. 1, showing part of the cross-sectional structure of the semiconductor integrated circuit of this embodiment, to demonstrate probing against the probe testing region 200a of the contact pad 304.

The lower part is the same as that in FIG. 4. The contact pad 304 is formed in the opening 956, and the protective overcoat layer 955 is formed on the fourth inter-level insulator layer 950 exposing the contact pad 304. The contact pad 304 has the bonding region 304a and the probe testing region 200a. A probe needle 52 is shown as being used for probing against the probe testing region 200a.

Figure 6:
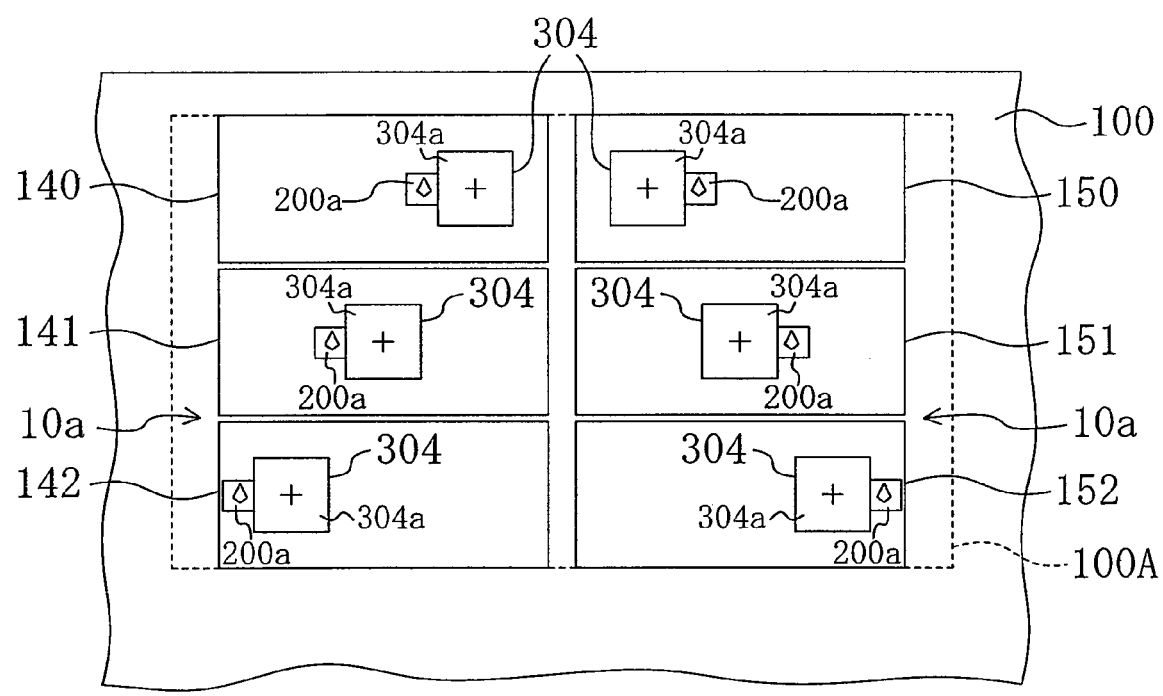
FIG. 6 is a simplified plan view illustrating probe marks left during probe testing in Embodiment 1 of the present invention.

FIG. 6 is a plan view, corresponding to the plan view of FIG. 1, illustrating probe marks (shown in the probe testing regions 200a) left by the probe needles 52 during the probing shown in FIG. 5.

As shown in FIG. 6, with the bonding region 304a and the probe testing region 200a provided for each of the contact pads 304 located right above the power transistor 100A, no probe mark is left in the bonding region 304a due to the stress applied to the contact pad 304 even after a plurality of times of probe testing. This provides an additional merit of ensuring execution of bonding.

As described above, by adopting the structure that each contact pad 304 has the bonding region 304a and the probe testing region 200a, or that a contact pad for probe testing is placed next to a contact pad having only the bonding region 304a, the following merits can be obtained. First, the existence of the exclusive region or exclusive contact pad for probe testing permits release from the constraints of the measurement/fabrication facilities, and secondly, the existence of the exclusive region or exclusive contact pad for bonding improves the reliability of adhesiveness.

By adopting a power transistor as the active element, the ON resistance of the POE-based power transistor element can be reduced, and thus power reduction under the PWM drive can be attained.

By placing the contact pads 304 at different distances from the chip edge (nearest located chip side) (see FIG. 1 or 6), any adjacent contact pads 304 can be avoided from coming into electrical contact with each other during probing or bonding. This placement is therefore adaptable to a narrower pad pitch.

The buses 140 to 142 connected to the sources of the power transistor and the buses 150 to 152 connected to the drains thereof are respectively formed by equally dividing a large-size bus of the power transistor. The contact pads 304, each connected to each of the buses 140 to 142 and 150 to 152, are placed right above the power transistor. Therefore, the stress applied to the metal layer constituting the large-size buses at wire bonding and probing during testing is dissipated with the slits 10a dividing the large-size buses into the equal-size buses. This suppresses occurrence of warping that would otherwise occur in a large-size bus susceptible to stress, and thus can reduce the stress applied to the entire power transistor. In this way, warping is prevented from occurring on the periphery of the top-layer buses formed under the contact pads 304, and thus cracking is prevented from occurring in the insulating film at the periphery of the contact pads. As a result, the reliability of the semiconductor integrated circuit improves.

As described above, in Embodiment 1 of the present invention, since the mechanical stress applied to each active element is dissipated, the reliability improves. Having the exclusive regions for probe testing, the constraints of the measurement/fabrication facilities can be avoided, and having the exclusive regions for bonding, the reliability of adhesiveness can be improved. Also, since the POE-based topmost layer is free from any under-layer constraints, reliability-oriented layout can be realized.

Moreover, the ON resistance of the POE-based power transistor element can be reduced, and thus power reduction under the PWM drive can be attained.

In addition, the placement is adaptable to a narrower pad pitch in probing and bonding.

Embodiment 2

A semiconductor integrated circuit device and a fabrication method for the same of Embodiment 2 of the present invention will be described with reference to the relevant drawings.

Figure 7:
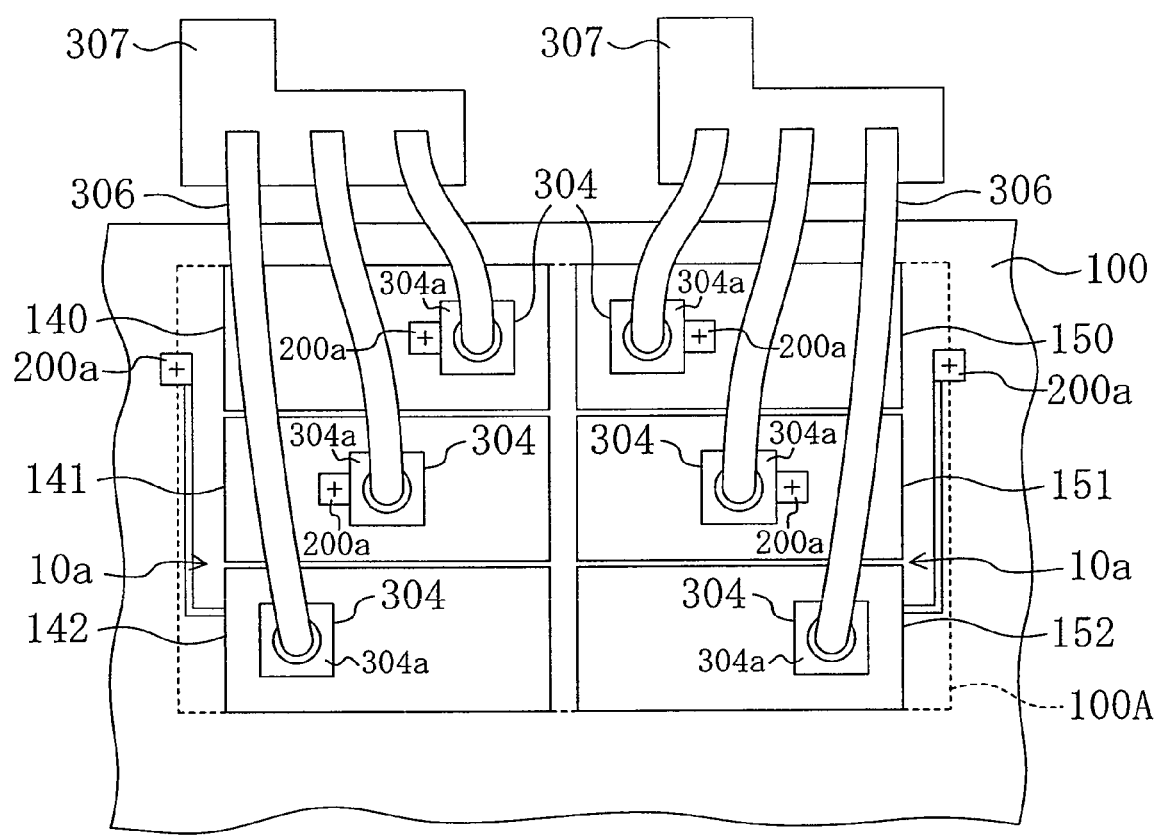
FIG. 7 is a simplified plan view diagrammatically showing part of an IC chip, as a portion of a semiconductor integrated circuit device of Embodiment 2 of the present invention, having a bus metal layer divided into a plurality of buses with slits, in which one contact pad having a probe testing region and a bonding region is connected to each bus, a contact pad for probe testing is further placed for probe testing of electrical characteristics of some of the buses, and the contact pad for probe testing connected to a power transistor is placed near the chip periphery.

FIG. 7 is a simplified plan view of part of the semiconductor integrated circuit device of Embodiment 2 of the present invention.

As shown in the plan view of FIG. 7, a power transistor 100A surrounded with an isolation layer is formed as an active element in an IC chip 100. Buses 140 to 142 and buses 150 to 152 are formed to cover source and drain regions of the power transistor 100A. The buses 140 to 142, which are in a topmost metal layer (third metal layer) made of sheet-like metal, are connected with source electrodes. The buses 140 to 142 are obtained by dividing a large-size bus equally with slits 10a. Likewise, the buses 150 to 152, which are in the topmost metal layer (third metal layer) made of sheet-like metal, are connected with drain electrodes. The buses 150 to 152 are obtained by dividing a large-size bus equally with slits 10a. One contact pad 304 is formed on each of the buses 140 to 142 and 150 to 152. One external lead frame 307 (power supply) is provided for the buses 140 to 142, and one external lead frame 307 (power supply) is provided for the buses 150 to 152. A bonding wire 306 is provided to connect the lead frame 307 with each contact pad 304.

Each of the contact pads 304 has a bonding region 304a and a probe testing region 200a, except for those located at the bottom as viewed from FIG. 7, which have only the bonding region 304a. A contact pad 200a for probe testing as the probe testing region of each of the buses 142 and 152 located closer to the center of the IC chip is drawn out with a lead and placed at a position closer to the periphery of the IC chip.

With the configuration described above, in Embodiment 2, the following effect is obtained in addition to the effects described in Embodiment 1. That is, with the contact pads 200a for probe testing for the buses 142 and 152 drawn out with a lead outside the buses 142 and 152, the constraints arising from the diameter of the bases of probe needles are eliminated, unlike the case of arranging the compact pads for probe testing (probe testing regions) 200a linearly in one row with respect to a chip side (see FIG. 1, for example). This arrangement is therefore adaptable to a narrower pad pitch in probing.

Embodiment 3

Semiconductor integrated circuits and fabrication methods for the same of Embodiment 3 of the present invention will be described with reference to the relevant drawings.

FIGS. 8A and 8B are simplified plan views of part of semiconductor integrated circuits of Embodiment 3 of the present invention.

As shown in the plan view of FIG. 8A, a power transistor 100A surrounded with an isolation layer is formed in an IC chip 100. A single first bus 140 and a single second bus 150 are formed to cover source and drain regions of the power transistor 100A. The first bus 140, which is in a topmost metal layer (third metal layer) made of sheet-like metal, is connected to source electrodes. Likewise, the second bus 150, which is also in the topmost metal layer (third metal layer) made of sheet-like metal, is connected to drain electrodes. One contact pad 304 is formed on each of the first and second buses 140 and 150. The contact pad 304 has a bonding region 304a and a probe testing region 200a. One external lead frame 307 (power supply) is provided for each of the first and second buses 140 and 150, and a bonding wire 306 is provided to connect the lead frame 307 with the bonding region 304a of the contact pad 304.

Also, as shown in FIG. 8A, slits 10b are formed at the upper, lower, left and right edges, as viewed from the figure, of each of the first and second buses 140 and 150. Having these slits, the stress caused by a load applied to the contact pad 304 at wire bonding and at probing during testing can be relieved.

Likewise, as shown in the plan view of FIG. 8B, a power transistor 100A surrounded with an isolation layer is formed in an IC chip 100. A single first bus 140 and a single second bus 150 are formed to cover source and drain regions of the power transistor 10A. The first bus 140, which is in a topmost metal layer (third metal layer) made of sheet-like metal, is connected to source electrodes. Likewise, the second bus 150, which is also in the topmost metal layer (third metal layer) made of sheet-like metal, is connected to drain electrodes. Three contact pads 304 are formed on each of the first and second buses 140 and 150. The contact pad 304 in the center of each of the buses 140 and 150 has a bonding region 304a and a probe testing region 200a. One external lead frame 307 (power supply) is provided for each of the first and second buses 140 and 150, and a bonding wire 306 is provided to connect the lead frame 307 with each contact pad 304.

Also, as shown in FIG. 8B, slits 10b are formed at the upper, lower, left and right edges, as viewed from the figure, of each of the first and second buses 140 and 150. Having these slits, the stress caused by a load applied to the contact pads 304 at wire bonding and at probing during testing can be relieved.

Next, the positional relationship among the buses as the topmost metal layer and underlying two metal layers in the semiconductor integrated circuits shown in FIGS. 8A and 8B described above will be described.

Figure 9:
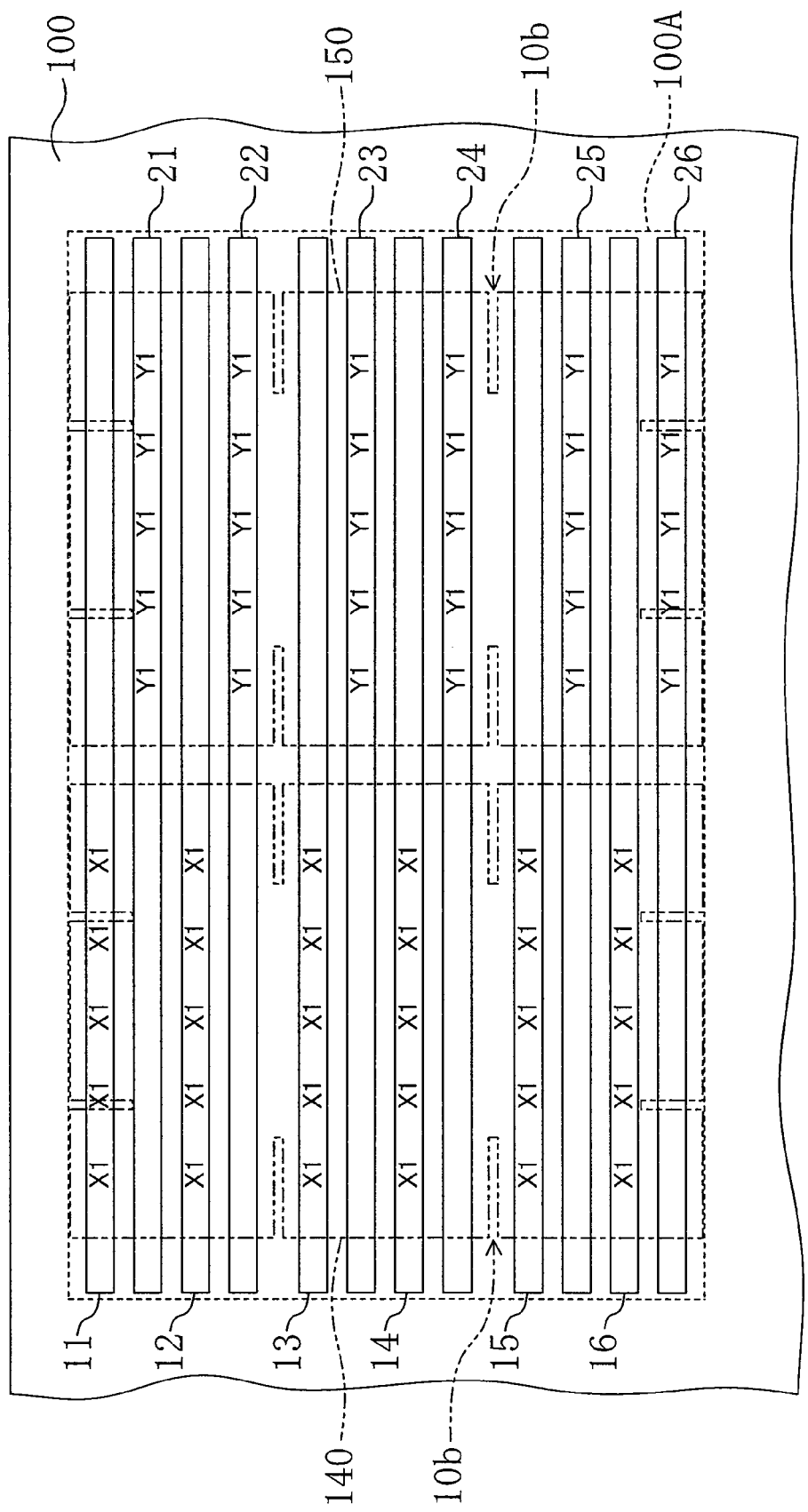
FIG. 9 is a simplified plan view diagrammatically showing part of an IC chip, as a portion of the semiconductor integrated circuit device of Embodiment 3 of the present invention, illustrating the positional relationship among a bus metal layer (third-layer buses) that is to be two single buses having slits formed at the upper, lower, left and right edges thereof, a metal layer (second-layer buses) underlying the above metal layer, which is to be lines for source and drain electrodes, and vias.

FIG. 9 is a plan view diagrammatically showing the positional relationship between the buses 140 and 150 shown in FIG. 8A and the underlying metal layer. Note that the buses 140 and 150 are shown by phantom lines in FIG. 9. Note also that although the semiconductor integrated circuit shown in FIG. 8A is used as an example in the following description, the relationship will also apply to the semiconductor integrated circuit shown in FIG. 8B.

As shown in FIG. 9, under the buses 140 and 150 as the third-layer buses in this embodiment, formed alternately are source lines 11, 12, 13, 14, 15 and 16 (first metal patterns) and drain lines 21, 22, 23, 24, 25 and 26 (second metal patterns), both as the second-layer buses (second metal layer), which are arranged in lateral elongated stripes parallel to one another at a fixed pitch. The third-layer bus 140 is connected to the source lines 11, 12, 13, 14, 15 and 16 as the second-layer buses via a plurality of metal-filled vias X1. Likewise, the third-layer bus 150 is connected to the drain lines 21, 22, 23, 24, 25 and 26 via a plurality of metal-filled vias Y1.

Note that the positional relationship between the second-layer buses and first-layer buses is roughly the same as that shown in FIG. 3 except for the position of the top-layer buses, and thus description thereof is omitted here.

Note that FIGS. 8A, 8B and 9 are views for mainly demonstrating the positional relationship among the first-layer to third-layer buses, vias, contact pads and bonding wires formed on the semiconductor substrate. As for specific configurations of interlayer insulating films not shown formed between buses, openings and the like, description will be made in a specific example shown in FIGS. 10A and 10B.

Figure 10A:
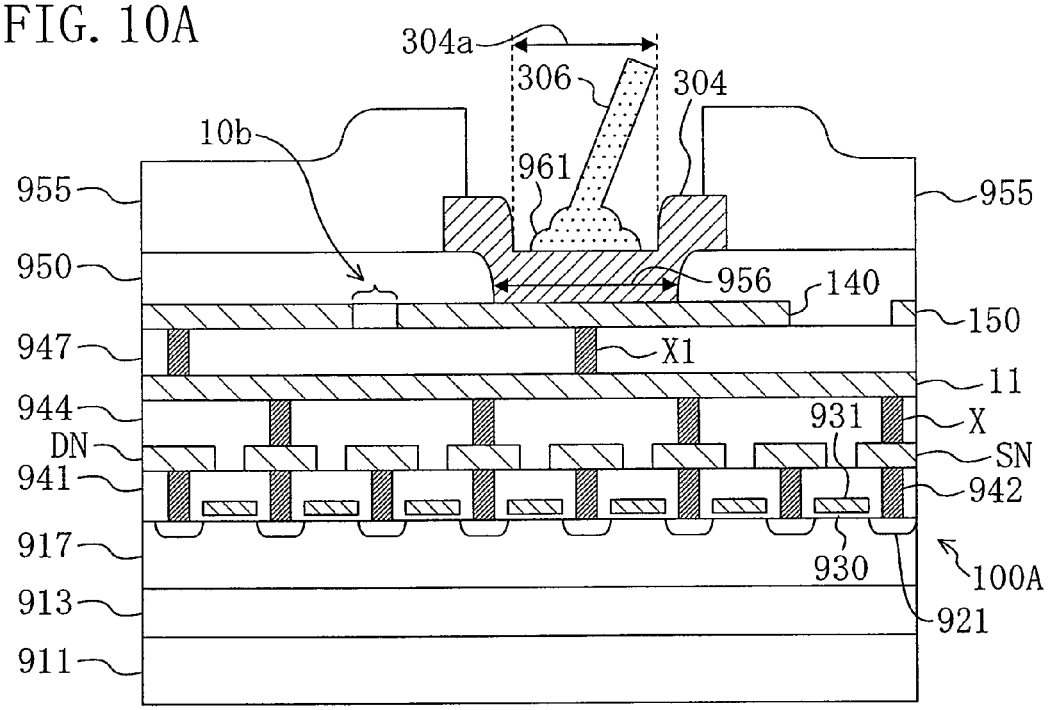
FIGS. 10A and 10B are cross-sectional views of a portion of the semiconductor integrated circuit device of Embodiment 3 of the present invention, taken along line Xa-Xa and line Xb-Xb, respectively, in FIG. 8B, where

FIG. 10A is a cross-sectional view taken along line Xa-Xa in FIG. 8B, showing part of the cross-sectional structure of the semiconductor integrated circuit device of this embodiment. Note that although the cross-sectional structure of the semiconductor integrated circuit device shown in FIG. 8A is not specifically described, it should be easily conceived from the following description with reference to FIG. 10A.

As shown in FIG. 10A, an n-type buried region 913, an n-type well region 917, source/drain contact regions 921, gate oxides 930 and polysilicon gates 931 are formed on a p-type silicon substrate 911. A first inter-level insulator layer 941 is formed covering these elements. First vias 942 are formed through the first inter-level insulator layer 941 to reach the source/drain contact regions 921. Lines SN for source electrodes and lines DN for drain electrodes (both first-layer buses) made of a metal layer are formed on the first inter-level insulator layer 941. A second inter-level insulator layer 944 is formed to cover the lines SN for source electrodes and the lines DN for drain electrodes. Second vias X are formed through the second inter-level insulator layer 944 to be in contact with the lines SN for source electrodes. Although not shown, vias in contact with the lines DN for drain electrodes are also formed through the second inter-level insulator layer 944. A source line (second-layer bus) 11, for example, made of a metal layer is formed on the second inter-level insulator layer 944 (a drain line (second-layer bus) is also formed in a similar manner in a section not shown). A third inter-level insulator layer 947 is formed covering the source lines and the drain lines not shown. Third vias X1 are formed through the third inter-level insulator layer 947 to be in contact with the source line 11 (likewise, vias are also formed to be in contact with a drain line in a section not shown). Third-layer buses 140 and 150 made of a metal layer are formed on the third inter-level insulator layer 947. Slits 10b are formed in the third-layer buses 140 and 150 (no slit formed in the bus 150 is shown). A fourth inter-level insulator layer 950 having an opening 956 is formed covering the buses 140 and 150. A contact pad 304 is formed inside the opening 956. A protective overcoat layer 955 is formed on the fourth inter-level insulator layer 950 exposing the contact pad 304. A ball 961 and a bonding wire 306 are formed on the bonding region 304a of the contact pad 304.

Figure 10B:
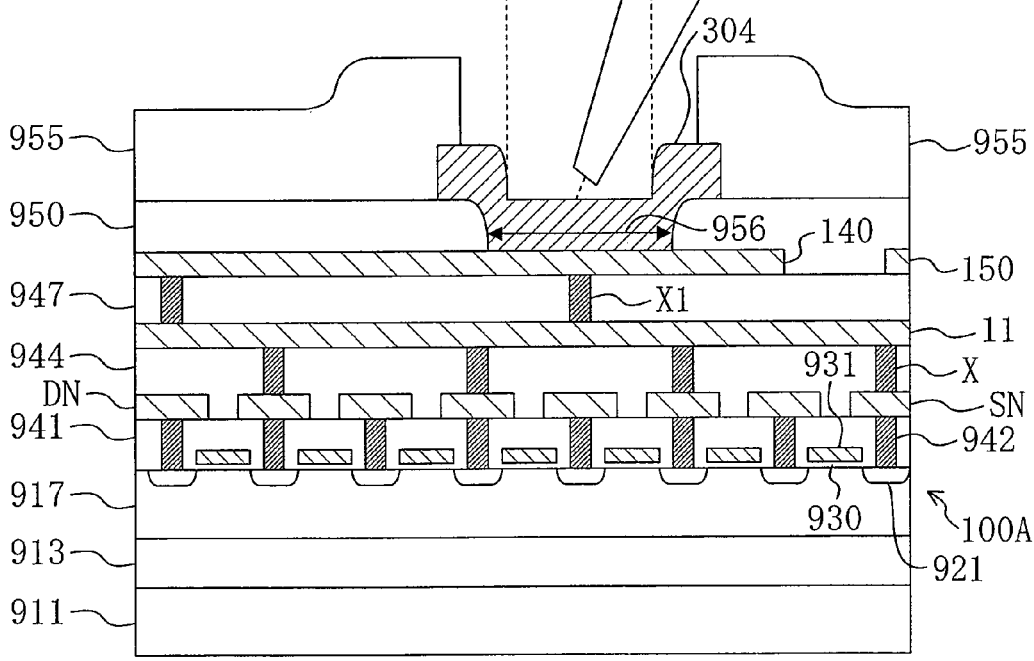

FIG. 10B is a cross-sectional view taken along line Xb-Xb in FIG. 8B, showing part of the cross-sectional structure of the semiconductor integrated circuit of this embodiment, to demonstrate probing against the probe testing region 200a of the contact pad 304.

The lower part in FIG. 10B is the same as that in FIG. 10A. The contact pad 304 is formed in the opening 956, and the protective overcoat layer 955 is formed on the fourth inter-level insulator layer 950 exposing the contact pad 304. The contact pad 304 has the probe testing region 200a, and a probe needle 52 is shown as being used for probing.

The difference between the semiconductor integrated circuit devices of FIGS. 8A and 8B is that in FIG. 8B, a plurality of contact pads 304 for bonding are connected to each of the single first bus 140 and the single second bus 150. In the configuration of FIG. 8B, therefore, with the increased number of bonding wires 306, the current allowance can be increased. This eliminates the constraints related to the bonding wire 306 in attainment of a large-current power transistor and reduces the resistance component of the bonding wire 306 in the entire resistance of the power transistor. Thus, while reduction in the resistance of the power transistor is intended, the current allowance of the power transistor as a whole can further be increased.

The difference between the semiconductor integrated circuit device of FIG. 8B and the semiconductor integrated circuit device of FIG. 1 is that in FIG. 8B, each of the first and second buses 140 and 150 is formed as a single bus. In FIG. 8B, therefore, only one probe testing region 200a of the contact pad 304 is necessary for each bus, and thus the pad pitch for the power transistor can be lowered in probing during probe testing.

Figure 17:
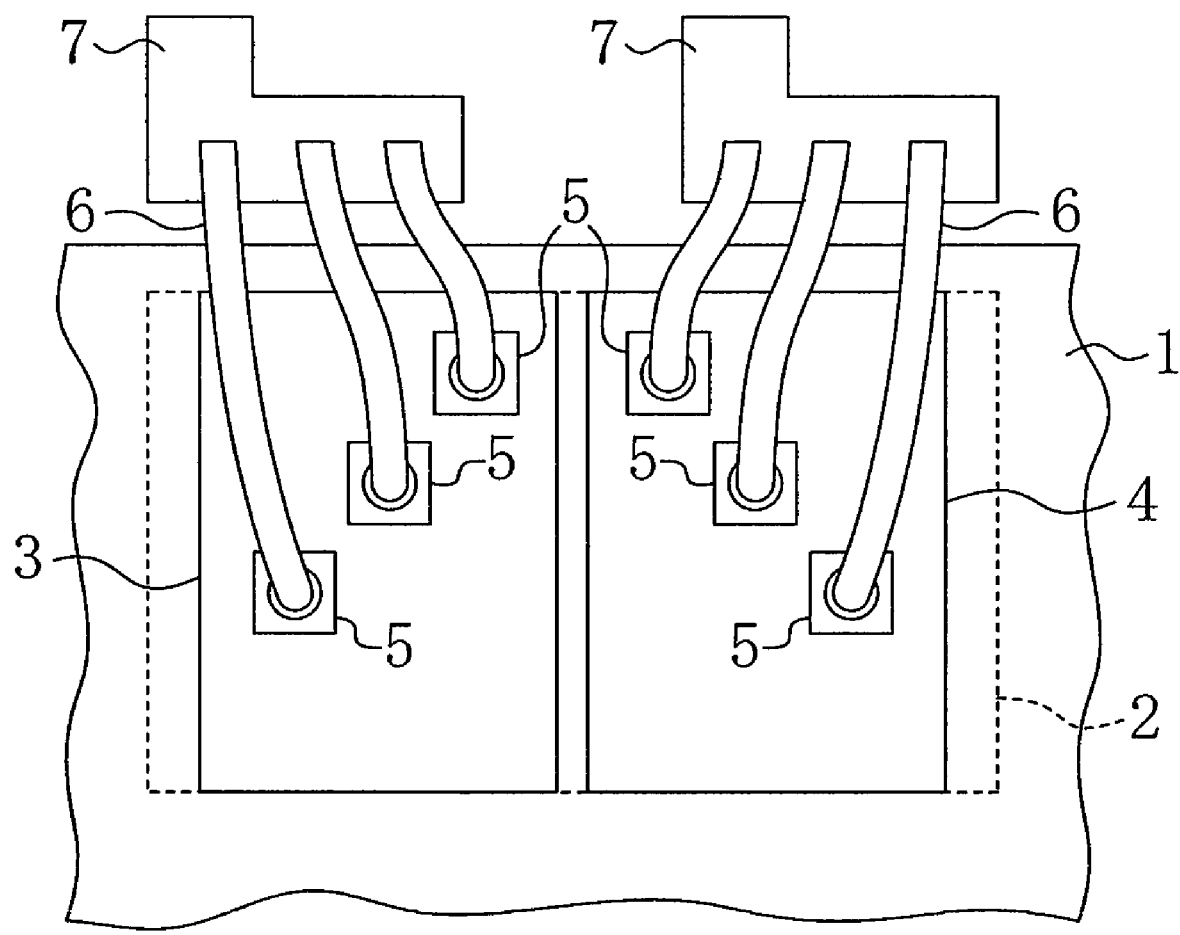
FIG. 17 is a simplified plan view diagrammatically showing a portion of a conventional IC chip including a power transistor in which a plurality of contact pads are placed on each metal bus and commonly connected with the metal bus.
Figure 20A:
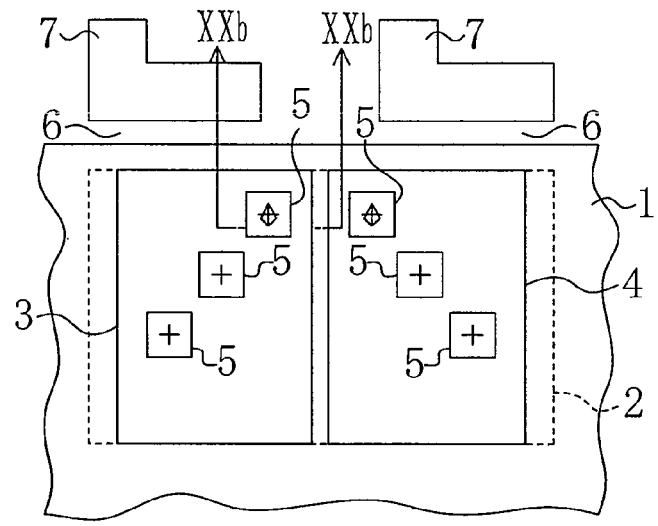
FIGS. 20A and 20B are a simplified plan view and a cross-sectional view taken along line XXb-XXb in FIG. 20A, respectively, for demonstrating a problem in a conventional semiconductor integrated circuit device, where
Figure 20B:
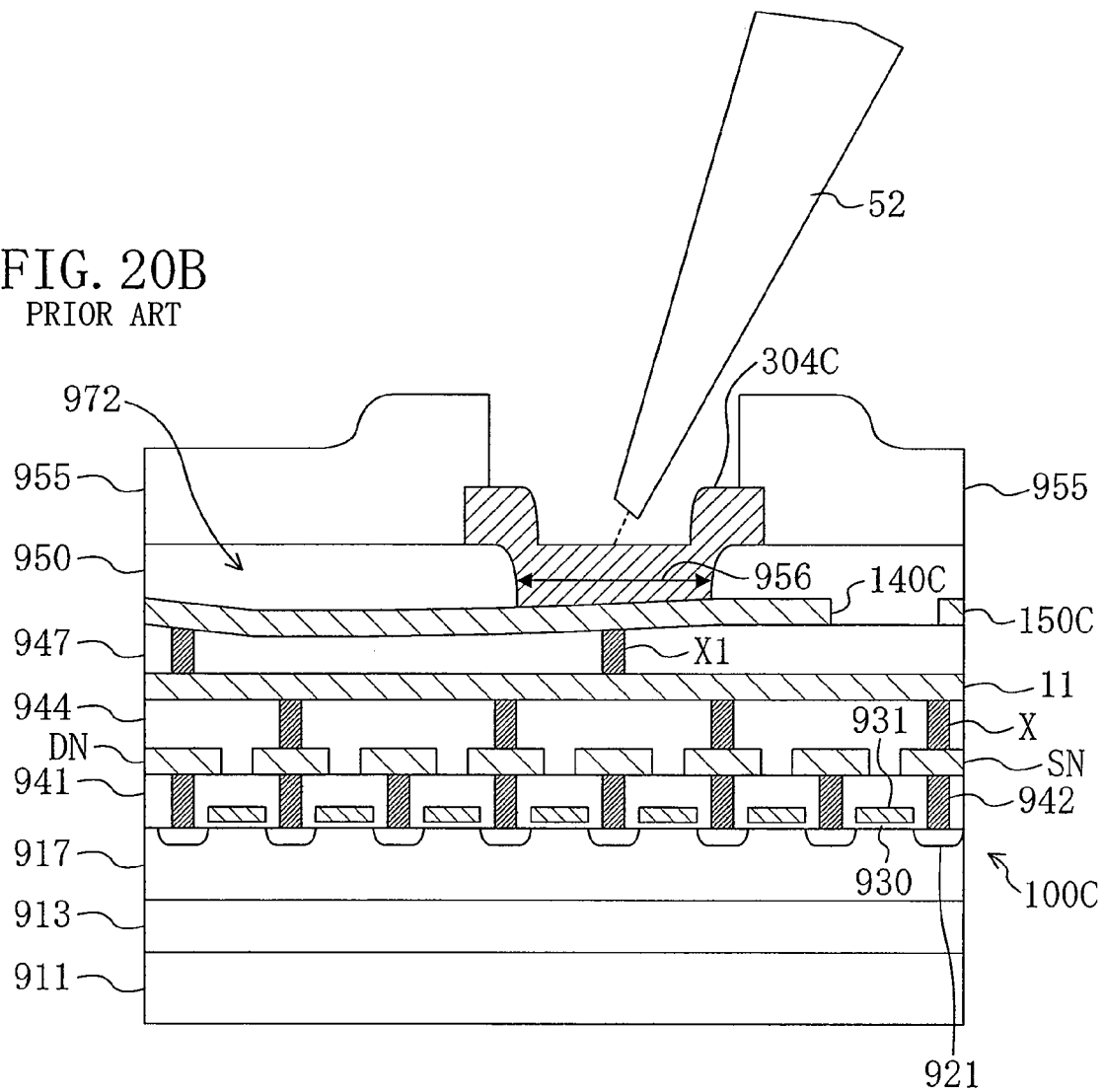

Also, as is apparent from the comparison of the semiconductor integrated circuit device of FIG. 8B with the conventional semiconductor integrated circuit device of FIG. 17, the slits 10b are provided at the edges of the top-layer buses 140 and 150 in the semiconductor integrated circuit device of this embodiment shown in FIG. 8B while nothing special is devised in the top-layer buses of the power transistor in the conventional device. With this difference in configuration, the semiconductor integrated circuit device of this embodiment can produce the following effect that is unattainable in the conventional device. That is, since the stress applied at wire bonding or at probing during testing is dissipated with the slits 10b, warping can be suppressed from occurring on the periphery of the top-layer buses formed under the contact pads 304, and thus cracking can be prevented from occurring in the insulating film at the periphery of the contact pads 304. As a result, the reliability of the semiconductor integrated circuit can be improved.

In the semiconductor integrated circuits shown in FIGS. 8A and 8B, the slits 10b were placed at the upper, lower, left and right edges of the first and second buses 140 and 150 as viewed from the figures. Although not specifically illustrated, the slits 10b may be placed at either the upper and lower edges or the left and right edges. In this case, also, the stress applied at wire bonding or at probing during testing can be dissipated with the slits 10b. Thus, with at least one or more slits formed at each of the first and second buses 140 and 150, the mechanical stress applied to each power transistor element can be dissipated, and this improves the reliability.

As described above, in Embodiment 3 of the present invention, with the dissipation of the mechanical stress applied to each active element, the reliability improves. Having the exclusive regions for probe testing, the constraints of the measurement/fabrication facilities can be avoided, and having the exclusive regions for bonding, the reliability of adhesiveness improves. Also, since the POE-based topmost layer is free from any under-layer constraints, reliability-oriented layout can be realized.

Also, the ON resistance of the POE-based power transistor element can be reduced, and this permits power reduction under the PWM drive.

In addition, the placement of this embodiment is adaptable to a narrower pad pitch at probing and bonding.

The slits formed at the top-layer buses can absorb the stress applied in the bonding process or during probe testing. It is therefore possible to prevent occurrence of warping at the wide top-layer buses and thus prevent occurrence of cracking at the periphery of the contact pads. This permits placement of a contact pad right above each active element, and thus a highly reliable semiconductor integrated circuit device can be implemented.

Moreover, by placing a power-supply contact pad right above an active element, precious silicon real estate can be saved. By reducing the silicon area consumed in the entire circuit design, the cost of the IC chip can be reduced. In other words, saving in IC chip area and reduction in IC cost can be attained.

Embodiment 4

Semiconductor integrated circuits and fabrication methods for the same of Embodiment 4 of the present invention will be described with reference to the relevant drawings.

Figure 11A:
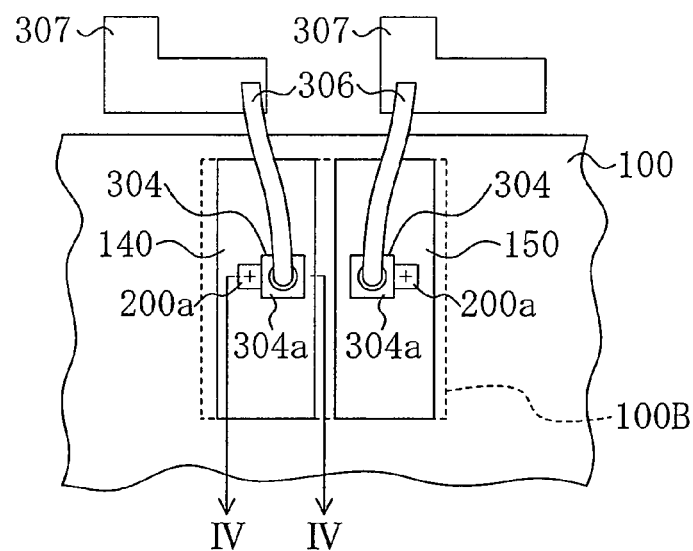
FIGS. 11A to 11C are simplified plan views each diagrammatically showing part of an IC chip, as a portion of a semiconductor integrated circuit device of Embodiment 4 of the present invention, having two single buses, in which one contact pad having a probe testing region and a bonding region (or one contact pad having only a bonding region) is placed on each bus, and the position of wire bonding is roughly at the center of each bus.
Figure 11B:
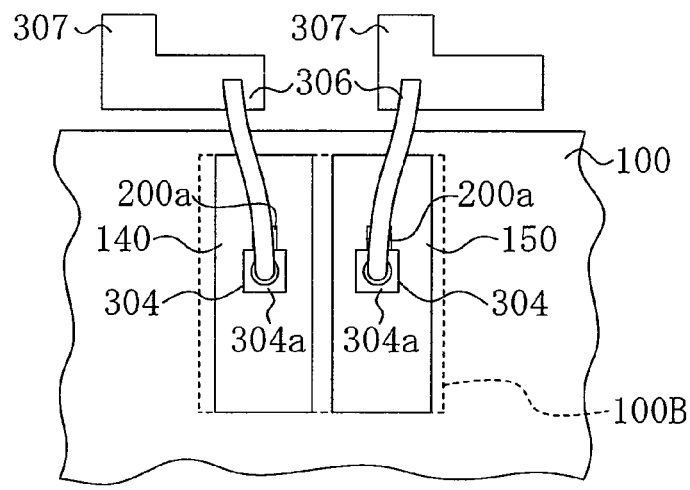
Figure 11C:
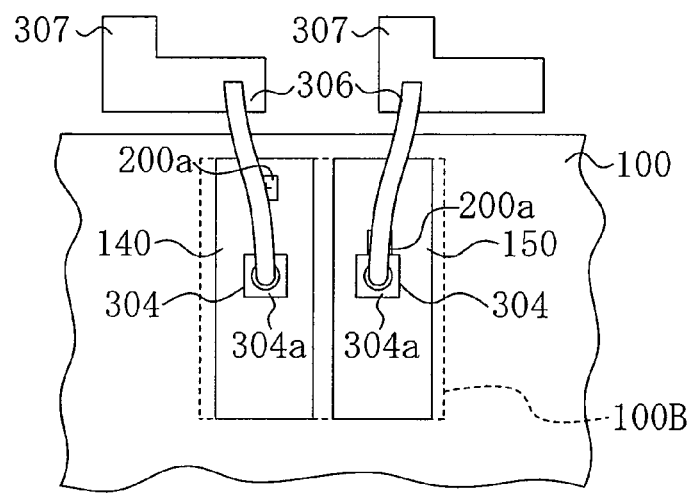

FIGS. 11A to 11C are simplified plan views of part of semiconductor integrated circuits of Embodiment 4 of the present invention.

As shown in the plan views of FIGS. 11A and 11B, a power transistor 100B surrounded with an isolation layer is formed as an active element. A single first bus 140 and a single second bus 150 are formed to cover source and drain regions of the power transistor 100B. The first bus 140, which is in a topmost metal layer (third metal layer) made of sheet-like metal, is connected to source electrodes. Likewise, the second bus 150, which is also in the topmost metal layer (third metal layer) made of sheet-like metal, is connected to drain electrodes. One contact pad 304 is formed on each of the first and second buses 140 and 150. One external lead frame 307 (power supply) is provided for each of the first and second buses 140 and 150, and a bonding wire 306 is provided to connect the lead frame 307 with the contact pad 304. The contact pad 304 is placed near the center of each of the first and second buses 140 and 150, and has a bonding region 304a and a probe testing region 200a.

The cross-sectional structure taken along line IV-IV in FIG. 11A is substantially the same as that of FIGS. 4 and 5. As for the cross-sectional structure of the semiconductor integrated circuit device of FIG. 11B, no specific description will be made. The portion of the lower part thereof that is not covered by FIGS. 4 and 5 should be easily conceived from the description in Embodiment 1, and thus description thereof is omitted.

With the above configuration, in wire bonding and probing during testing, the stress caused by a load applied to each contact pad 304 is dissipated and relieved.

The power transistors 100B shown in FIGS. 11A and 11B, as well as that shown in FIG. 11C to be described later, are small in size compared with the power transistor A shown in FIG. 1. The size of buses is therefore small, and thus the influence of warping caused by the stress can be further reduced.

Also, the buses shown in FIGS. 11A and 11B, as well as those in FIG. 11C to be described later, are of a shape whose short side is a side parallel to the chip edge (nearest located chip side) and whose long side is a side orthogonal to the chip edge. This configuration is therefore adaptable to a narrower pad pitch in probing or bonding, and thus permits chip shrinking and chip area saving.

The difference between the configurations of FIGS. 11A and 11B is the placement of the probe testing regions 200a in the contact pads 304. For vertically elongated power transistors, the configuration of FIG. 11B is more adaptable to a narrower pad pitch in probing than that of FIG. 11A.

Next, as shown in the plan view of FIG. 11C, a power transistor 100B surrounded with an isolation layer is formed as an active element in an IC chip 100. A single first bus 140 and a single second bus 150 are formed to cover source and drain regions of the power transistor 100B. The first bus 140, which is in a topmost metal layer (third metal layer) made of sheet-like metal, is connected to source electrodes. Likewise, the second bus 150, which is also in the topmost metal layer (third metal layer) made of sheet-like metal, is connected to drain electrodes. One contact pad 304 is formed on each of the first and second buses 140 and 150. One external lead frame 307 (power supply) is provided for each of the first and second buses 140 and 150, and a bonding wire 306 is provided to connect the lead frame 307 with the contact pad 304. The contact pad 304 on the first bus 140 has only a bonding region 304a, and a contact pad 200a for probe testing, which is to be a probe testing region, is placed at a position closer to the chip periphery than the bonding region 304a. The contact pad 304 on the second bus 150 has a bonding region 304a and a probe testing region 200a, with the probe testing region 200a placed at a position closer to the chip periphery than the bonding region 304a.

That is, by placing the probe testing regions 200a and the contact pads 200a for probe testing in a staggered array with respect to one direction, the configuration of FIG. 11C is made adaptable to a further narrower pad pitch in probing.

As described above, in Embodiment 4 of the present invention, since the mechanical stress applied to each active element is dissipated, the reliability improves. Having the exclusive regions for probe testing, the constraints of the measurement/fabrication facilities can be avoided, and having the exclusive regions for bonding, the reliability of adhesiveness improves. Also, since the POE-based topmost layer is free from any under-layer constraints, reliability-oriented layout can be realized.

Also, the ON resistance of the POE-based power transistor element can be reduced, and this permits power reduction under the PWM drive.

In addition, the above configuration is adaptable to a narrower pad pitch in probing and bonding, and thus permits chip shrinking and chip area saving.

Embodiment 5

Semiconductor integrated circuits and fabrication methods for the same of Embodiment 5 of the present invention will be described with reference to the relevant drawings.

Figure 12A:
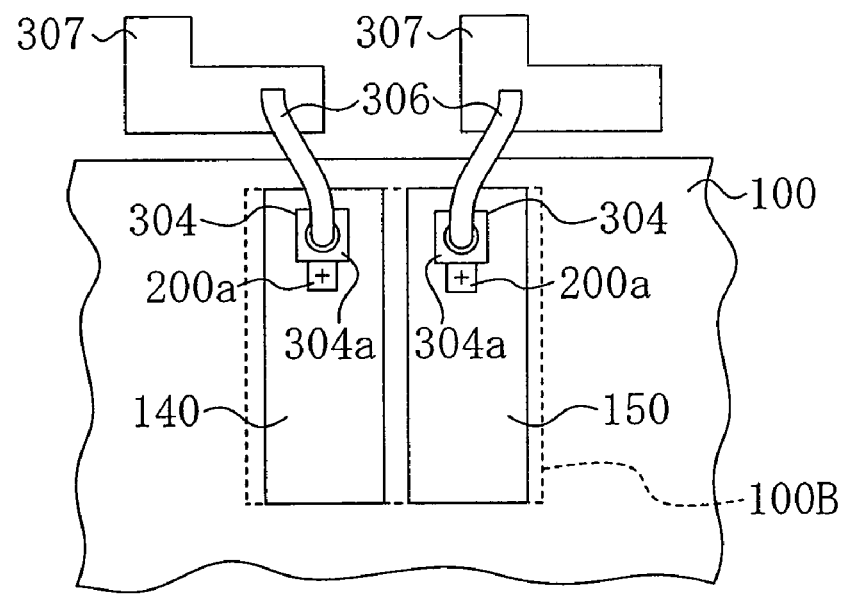
FIGS. 12A and 12B are simplified plan views each diagrammatically showing part of an IC chip, as a portion of a semiconductor integrated circuit device of Embodiment 5 of the present invention, having two single buses, in which one contact pad having a probe testing region and a bonding region (or one contact pad having only a bonding region) is placed on each bus, and the position of wire bonding is along the chip periphery on each bus.
Figure 12B:
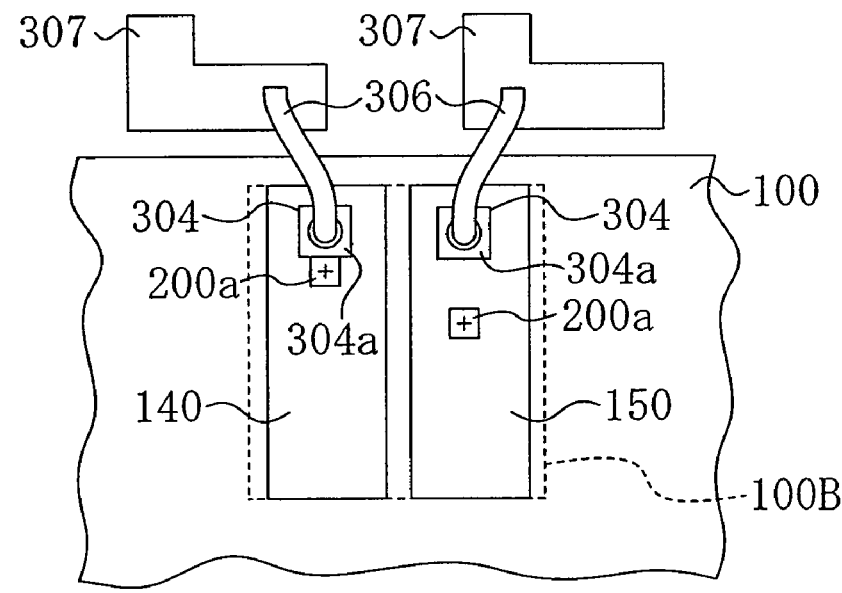

FIGS. 12A and 12B are simplified plan views of part of semiconductor integrated circuits of Embodiment 5 of the present invention.

As shown in the plan view of FIG. 12A, a power transistor 100B surrounded with an isolation layer is formed as an active element. A single first bus 140 and a single second bus 150 are formed to cover source and drain regions of the power transistor 100B. The first bus 140, which is in a topmost metal layer (third metal layer) made of sheet-like metal, is connected to source electrodes. Likewise, the second bus 150, which is also in the topmost metal layer (third metal layer) made of sheet-like metal, is connected to drain electrodes. One contact pad 304 is formed on each of the first and second buses 140 and 150. One external lead frame 307 (power supply) is provided for each of the first and second buses 140 and 150, and a bonding wire 306 is provided to connect the lead frame 307 with the contact pad 304. The contact pad 304 has a bonding region 304a and a probe testing region 200a, with the probe testing region 200a being placed at a position closer to the chip center than the bonding region 304a.

The power transistor 100B in FIG. 12A is small in size compared with the power transistor 100A in FIG. 1. The size of buses is therefore small, and thus the influence of warping caused by the stress can be further reduced.

With the contact pad 304 having the bonding region 304a and the probe testing region 200a, the stress caused by a load applied to the contact pad 304 at wire bonding and at probing during testing is dissipated and relieved.

Next, as shown in the plan view of FIG. 12B, a power transistor 100B surrounded with an isolation layer is formed as an active element. A single first bus 140 and a single second bus 150 are formed to cover source and drain regions of the power transistor 100B. The first bus 140, which is in a topmost metal layer (third metal layer) made of sheet-like metal, is connected to source electrodes. Likewise, the second bus 150, which is also in the topmost metal layer (third metal layer) made of sheet-like metal, is connected to drain electrodes. One contact pad 304 is formed on each of the first and second buses 140 and 150. One external lead frame 307 (power supply) is provided for each of the first and second buses 140 and 150, and a bonding wire 306 is provided to connect the lead frame 307 with the contact pad 304. The contact pad 304 on the first bus 140 has a bonding region 304a and a probe testing region 200a, with the probe testing region 200a placed at a position closer to the chip center than the bonding region 304a. The contact pad 304 on the second bus 150 has only a bonding region 304a, and a contact pad 200a for probe testing, which is to be a probe testing region, is placed at a position closer to the chip center than the bonding region 304a.

That is, by placing the probe testing regions 200a and the contact pads 200a for probe testing in a staggered array with respect to one direction, the configuration of FIG. 12B is made adaptable to a further narrower pad pitch in probing.

The difference between the semiconductor integrated circuit devices of FIGS. 11A to 11C and the semiconductor integrated circuit devices of FIGS. 12A and 12B is that in FIGS. 12A and 12B, the bonding region 304a (or the contact pad 304 having only the bonding region 304a) is placed at a position closer to the chip periphery than the probe testing region 200a (or the contact pad 200a for probe testing).

With the placement as described above, when the proportion of the resistance component of the wire length in the total resistance value of the power transistor is greater than the proportion of the ON resistance of the power transistor itself, the total resistance value of the power transistor can be reduced by shortening the wire length, and this permits power reduction under the PWM drive.

With the above configuration, Embodiment 5 of the present invention can produce the following effect in addition to the effects obtained in Embodiment 4. That is, by placing the bonding region 304a (or the contact pad 304 having only the bonding region 304a) at a position closer to the chip periphery than the probe testing region 200a (or the contact pad 200a for probe testing), the wire length is shortened. This reduces the wire resistance and thus permits power reduction.

Embodiment 6

A semiconductor integrated circuit and a fabrication method for the same of Embodiment 6 of the present invention will be described with reference to the relevant drawings.

Figure 13:
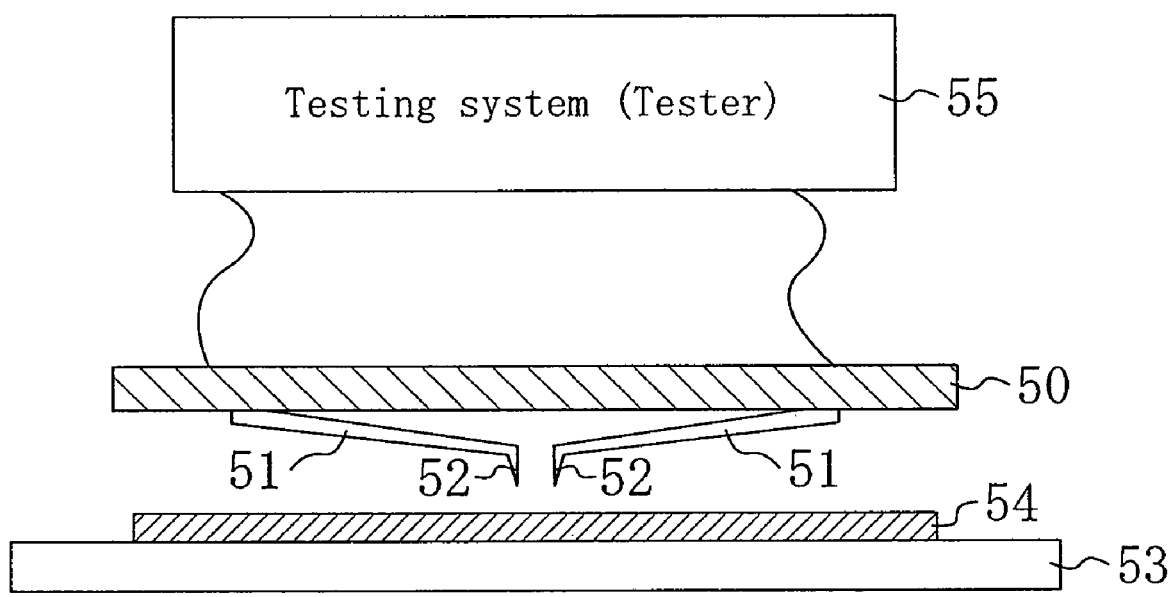
FIG. 13 is a schematic view illustrating a testing system (tester) for performing probe testing in Embodiment 6 of the present invention.

FIG. 13 is a schematic view illustrating a testing system (tester) for performing probe testing in a wafer testing process executed in fabrication of semiconductor integrated circuit devices.

An IC chip is tested with a testing system (tester) 55 at the stage of a wafer 54 before being diced. To test the wafer 54 on a wafer chuck 53, a probe card 50 is used to connect the testing system (tester) 55 to the wafer 54 having an IC chip. The probe card 50 has a number of probes 51 formed on one surface thereof, and each probe 51 has a probe needle 52 at its tip. The probe needles 52 come into contact with contact pads for bonding of an IC chip built on the wafer 54. The testing system (tester) 55 tests the electrical characteristics of the IC chip brought into contact via the probe needles 52.

Figure 14:
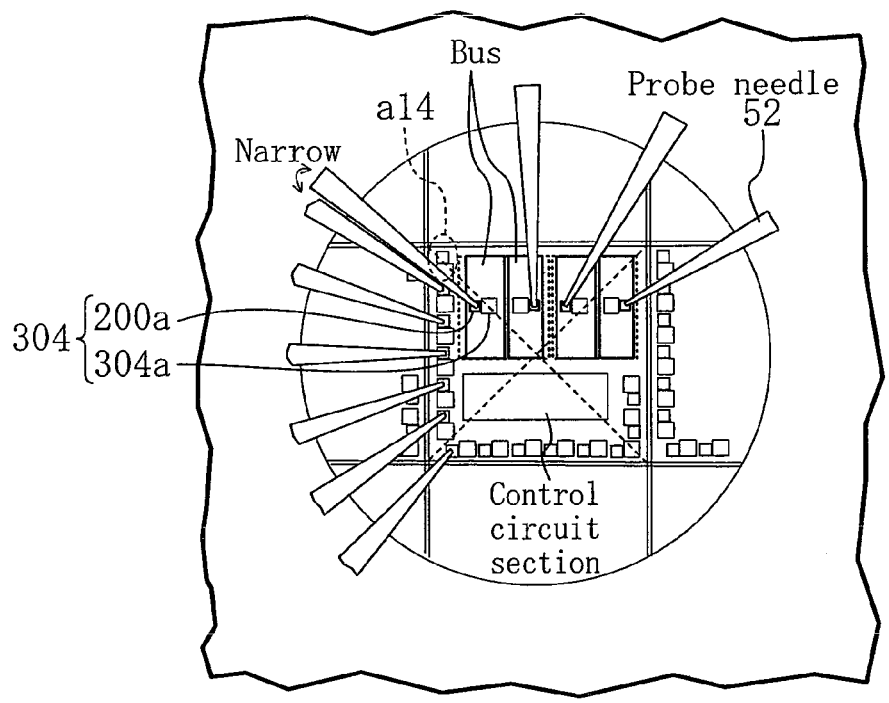
FIG. 14 is a simplified plan view of an IC chip, as a portion of a semiconductor integrated circuit device as an application of Embodiment 4 shown together with probe needles as viewed from above a probe card, in Embodiment 6 of the present invention, in which two single buses are provided, one contact pad having a probe testing region and a bonding region is placed on each bus, and the position of wire bonding is roughly at the center of each bus.

FIG. 14 shows a portion of a semiconductor integrated circuit device as an application of Embodiment 4 described above together with probe needles as viewed from above the probe card. Specifically, FIG. 14 is a simplified plan view of an IC chip in which two single buses are provided, one contact pad having a probe testing region and a bonding region is placed on each bus, and probe testing is being performed at roughly the center of each bus.

As shown in FIG. 14, two sets of the power transistors 100B in the IC chip shown in FIG. 11A are placed. Also placed are: a control circuit section including control circuits for controlling ON/OFF and the like of the power transistors 100B, protection circuits and the like; and contact pads 304 placed roughly around the chip periphery. Each of the contact pads 304 has the probe testing region 200a and the bonding region 304a.

As already described, FIG. 14 shows an IC chip formed on a wafer, depicting, as an image, probe needles as being mounted to direct toward the origin of the IC chip, for easy understanding of the feature. FIG. 14 is therefore intended by no means to restrict the scale of the entire chip, the sizes of each power transistor and the control circuit section, the number of output channels of the multichannel-ready power transistor, the number of stages of the power transistor array and the like.

In the layout of multichannel-ready power transistors considering reduction in ON resistance as shown in FIG. 14, numerous power transistors are placed and numerous contact pads 304 are arranged on the power transistors. In preparation of a probe card for a tester, therefore, the following problem arises. That is, for a contact pad 304 located in a corner portion a14 adjoining the power transistor, among the contact pads 304 arranged linearly with respect to a chip side of the IC chip, the corresponding probe needle 52 may come into electrical contact with its adjacent one due to the constraints of the diameter of the bases of the probe needles 52 (60 to 70 μm, for example). This makes it difficult to attain a narrower pad pitch.

Figure 15:
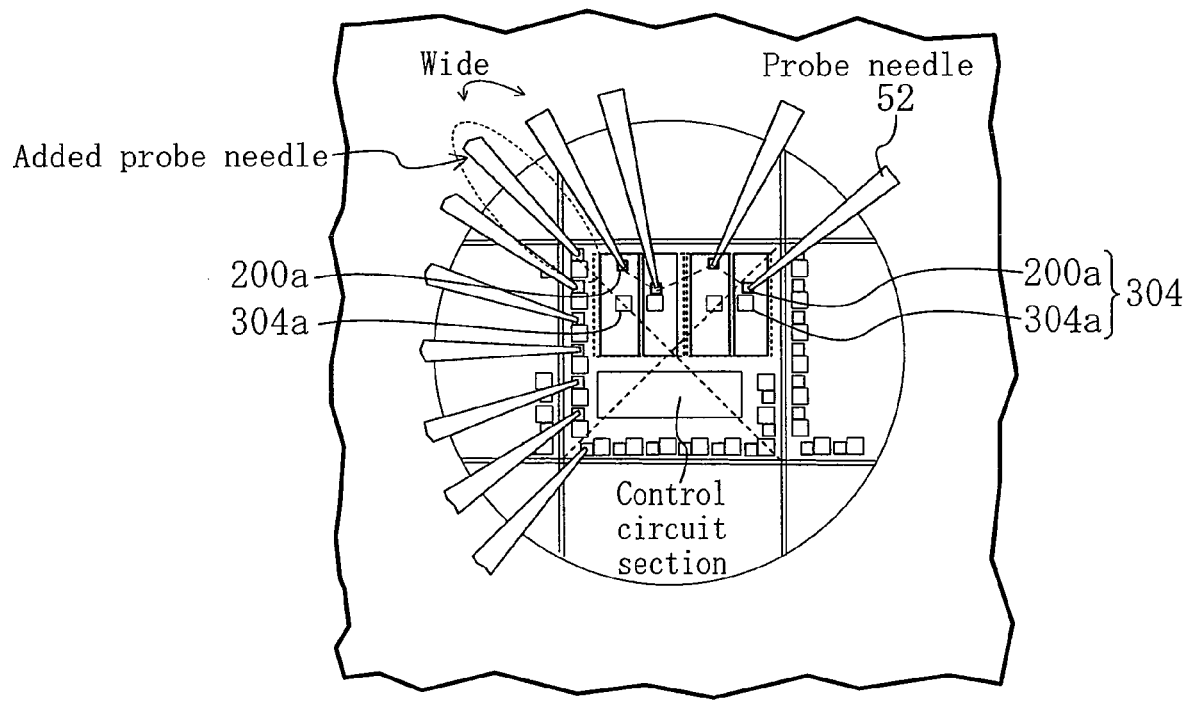
FIG. 15 is a simplified plan view of an IC chip, as a portion of a semiconductor integrated circuit device as another application of Embodiment 4 shown together with probe needles as viewed from above a probe card, in Embodiment 6 of the present invention, in which two single buses are provided, one contact pad having a probe testing region and a bonding region (or one contact pad having only a bonding region) is placed on each bus, and the position of probe testing is along the chip periphery on each bus.
Figure 16A:
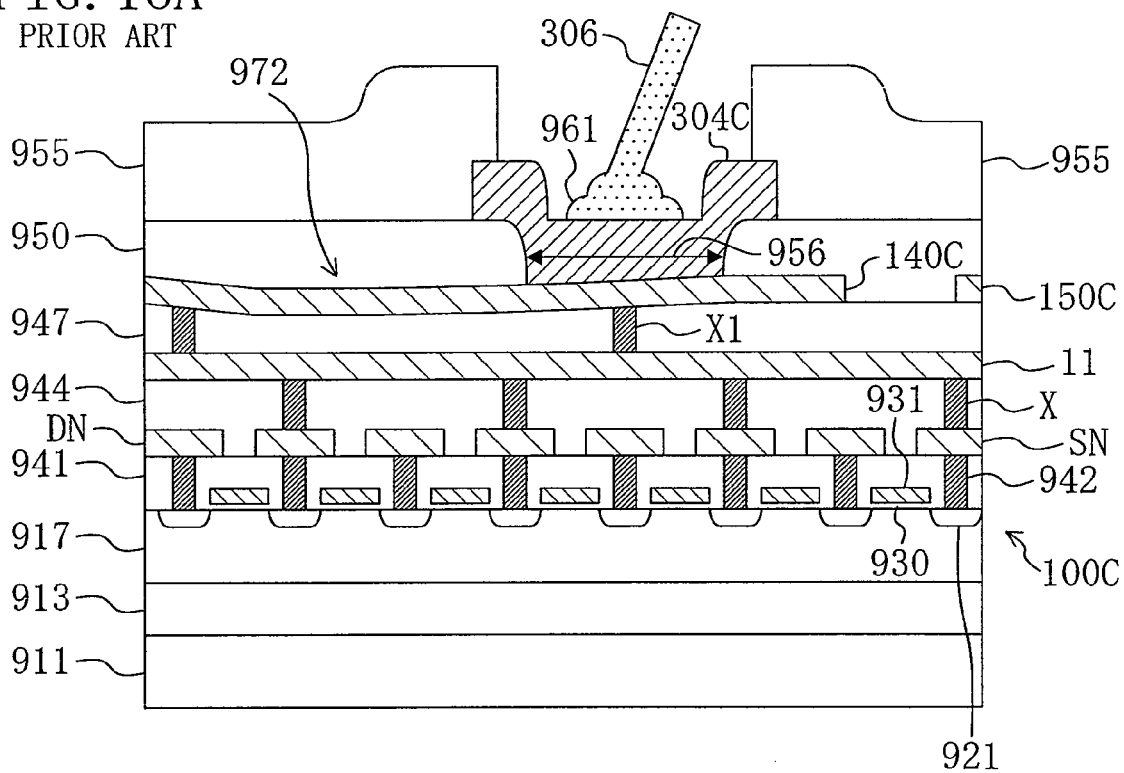
Figure 16B:
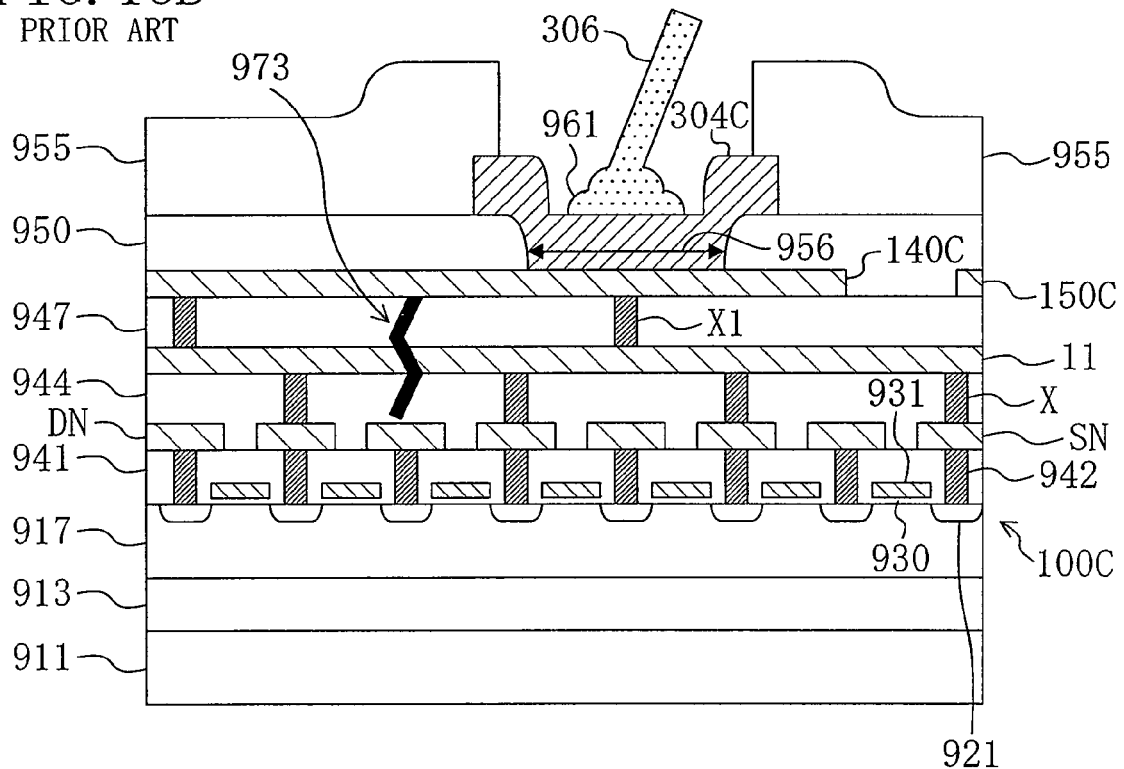

FIG. 15 shows a portion of a semiconductor integrated circuit device of another application of Embodiment 4 described above together with probe needles as viewed from above the probe card. Specifically, FIG. 15 is a simplified plan view of an IC chip in which two single buses are provided, one contact pad having a probe testing region and a bonding region is placed on each bus, and probe testing is being performed along the chip periphery on the buses.

As is apparent from comparison with the configuration of FIG. 14, in the configuration of FIG. 15, the probe testing regions 200a or the contact pads 200a for probe testing are placed in a staggered array with respect to one direction.

With the above configuration, Embodiment 6 of the present invention produces the following effect in addition to the effects obtained in Embodiments 1 to 5 described above. That is, since electrical contact between adjacent probe needles can be avoided by placing the probe testing regions 200a or the contact pads 200a for probe testing in a staggered array with respect to one direction, the configuration is adaptable to a narrower pad pitch in probing.

The present invention should not be construed as limited to the embodiments described above. It will be apparent to those skilled in the art that various modifications to the exemplified embodiments and combinations thereof, as well as embodiments other than those described above, are possible. As an example, the present invention generally covers semiconductor integrated circuit devices in which contact pads are placed above active components and the positions of the contact pads are selected to provide control and distribution of power to the active components under the contact pads. As another example, the present invention covers semiconductor ICs in which contact pads are placed above active components and the positions of the contact pads are determined to minimize the distance of power distribution between one selected contact pad and an active component, to which power should be supplied, corresponding to one or a plurality of contact pads. Accordingly, the appended claims should cover all such modifications and embodiments.

In the semiconductor integrated circuit devices and the fabrication methods for the same of the present invention, some contrivance is made on the layout of power integrated circuits in which wire bonding is performed right above active circuit regions using the POE technology, to thereby contribute to attainment of both power reduction and reliability improvement in the performance of major semiconductor electronic components such as power supplies, motor drivers, audio amplifiers and multichannel drivers. Accordingly, the present invention, which utilizes the existing facilities in fabrication, can be easily implemented at low cost and thus is greatly useful in implementing inexpensive, high-quality and high-performance power integrated circuits.

What is claimed is:

1. A semiconductor integrated circuit device comprising:
   an integrated active element formed on a semiconductor substrate;
   an interlayer insulating film formed on the active element;
   at least one or more first metal patterns made of a first metal layer formed in the interlayer insulating film at a position right above the active element, for acting as a first electrode of the active element;
   at least one or more second metal patterns made of the first metal layer for acting as a second electrode of the active element;
   a first bus made of a second metal layer formed in the interlayer insulating film at a position right above the first metal layer, the first bus being electrically connected with the at least one or more first metal patterns;
   a second bus made of the second metal layer, the second bus being electrically connected with the at least one or more second metal patterns;
   wherein each of the first bus and the second bus has at least one or more slits; and
   at least one or more contact pads provided on the first bus and the second bus,
   wherein the contact pad has a probe testing region and a bonding region.

2. The device of claim 1, wherein the active element is a power transistor.

3. The device of claim 1, wherein the probe testing regions adjacent to each other and the bonding regions adjacent to each other are respectively placed to be different in the distance from a neighboring chip side.

4. The device of claim 1, wherein each of the first bus and the second bus has a rectangular shape whose short side is a side parallel to a neighboring chip side and whose long side is a side orthogonal to the chip side.

5. The device of claim 1, wherein the probe testing region is placed closer to the chip periphery than the bonding region.

6. The device of claim 1, wherein the bonding region is placed closer to the chip periphery than the probe testing region.

7. The device of claim 1, wherein the probe testing regions are placed in a staggered array with respect to one direction.

8. A semiconductor integrated circuit device comprising:
an integrated active element formed on a semiconductor substrate;
an interlayer insulating film formed on the active element;
at least one or more first metal patterns made of a first metal layer formed in the interlayer insulating film at a position right above the active element, for acting as a first electrode of the active element;
at least one or more second metal patterns made of the first metal layer for acting as a second electrode of the active element;
at least one or more first buses made of a second metal layer formed in the interlayer insulating film at a position right above the first metal layer, the first bus being electrically connected with a corresponding first metal pattern among the at least one or more first metal patterns;
at least one or more second buses made of the second metal layer, the second bus being electrically connected with a corresponding second metal pattern among the at least one or more second metal patterns;
wherein each of the first bus and the second bus has at least one or more slits;
at least one or more contact pads for probe testing provided for each of the first bus and the second bus, the contact pad for probe testing including a probe testing region; and
at least one or more contact pads for bonding provided for each of the first bus and the second bus, the contact pad for bonding including a bonding region.

9. The device of claim 8, wherein the contact pad for probe testing is placed adjacent to the contact pad for bonding.

10. The device of claim 8, wherein the contact pad for probe testing is drawn out with a lead and positioned outside each of the first bus and the second bus.

11. The device of claim 8, wherein the active element is a power transistor.

12. The device of claim 8, wherein the probe testing regions adjacent to each other and the bonding regions adjacent to each other are respectively placed to be different in the distance from a neighboring chip side.

13. The device of claim 8, wherein each of the first bus and the second bus has a rectangular shape whose short side is a side parallel to a neighboring chip side and whose long side is a side orthogonal to the chip side.

14. The device of claim 8, wherein the probe testing region is placed closer to the chip periphery than the bonding region.

15. The device of claim 8, wherein the bonding region is placed closer to the chip periphery than the probe testing region.

16. The device of claim 8, wherein the probe testing regions are placed in a staggered array with respect to one direction.

* * * * *